United States Patent
Lu

(10) Patent No.: US 11,532,542 B2
(45) Date of Patent: Dec. 20, 2022

(54) WIRING STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 104 days.

(21) Appl. No.: 17/006,688

(22) Filed: Aug. 28, 2020

(65) Prior Publication Data

US 2022/0068781 A1 Mar. 3, 2022

(51) Int. Cl.
*H01L 23/498* (2006.01)
*H01L 23/00* (2006.01)
*H01L 21/48* (2006.01)
*H01L 23/48* (2006.01)

(52) U.S. Cl.
CPC ...... *H01L 23/49827* (2013.01); *H01L 21/486* (2013.01); *H01L 21/4857* (2013.01); *H01L 23/49822* (2013.01); *H01L 24/32* (2013.01); *H01L 24/83* (2013.01); *H01L 23/481* (2013.01); *H01L 2224/08235* (2013.01); *H01L 2224/08238* (2013.01); *H01L 2224/32225* (2013.01); *H01L 2224/8385* (2013.01)

(58) Field of Classification Search
CPC ........... H01L 23/49827; H01L 21/4857; H01L 21/486; H01L 23/49822; H01L 24/32; H01L 24/83; H01L 2224/08235; H01L 2224/08238; H01L 2224/32225; H01L 2224/8385; H01L 23/49816; H01L 23/5385; H01L 23/5384
See application file for complete search history.

(56) References Cited

U.S. PATENT DOCUMENTS

| 2005/0037601 A1* | 2/2005 | Hsu ........................ H01L 21/486 |
| | | 257/E23.06 |
| 2021/0057356 A1* | 2/2021 | Lu ......................... H01L 21/566 |

* cited by examiner

*Primary Examiner* — Jasmine J Clark
(74) *Attorney, Agent, or Firm* — Foley & Lardner LLP

(57) ABSTRACT

A wiring structure and a method for manufacturing the same are provided. The wiring structure includes a conductive structure and a plurality of conductive through vias. The conductive structure includes a dielectric layer, a circuit layer in contact with the dielectric layer, a plurality of dam portions and an outer metal layer. The dam portions extend through the dielectric layer. The dam portion defines a through hole. The outer metal layer is disposed adjacent to a top surface of the dielectric layer and extends into the through hole of the dam portion. The conductive through vias are disposed in the through holes of the dam portions and electrically connecting the circuit layer.

20 Claims, 35 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive through via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a conductive structure and a plurality of conductive through vias. The conductive structure includes a dielectric layer, a circuit layer in contact with the dielectric layer, a plurality of dam portions and an outer metal layer. The dam portions extend through the dielectric layer. The dam portion defines a through hole. The outer metal layer is disposed adjacent to a top surface of the dielectric layer and extends into the through hole of the dam portion. The conductive through vias are disposed in the through holes of the dam portions and electrically connecting the circuit layer.

In some embodiments, a wiring structure includes a lower element, an upper conductive structure and a plurality of conductive through vias. The upper conductive structure is attached to the lower element through a bonding layer. The upper conductive structure includes a dielectric layer, a circuit layer in contact with the dielectric layer, a plurality of dam portions and an outer metal layer. The dam portions extend through the dielectric layer. Each of the dam portions defines a through hole. The outer metal layer is disposed adjacent to a top surface of the dielectric layer and extends into the through hole of the dam portion. The conductive through vias are disposed in the through holes of the dam portions, and electrically connect the lower element and the circuit layer of the upper conductive structure.

In some embodiments, a method for manufacturing a wiring structure includes: (a) providing an upper conductive structure, wherein the upper conductive structure includes a dielectric layer, a circuit layer in contact with the dielectric layer, and a plurality of dam portions, wherein the dam portions extend through the dielectric layer, each of the dam portions defines a central hole; (b) attaching the upper conductive structure to a lower element through a bonding layer; (c) removing a portion of the dam portion corresponding to the central hole to form a through hole; (d) forming an outer metal layer adjacent to a top surface of the dielectric layer, wherein the outer metal layer extends into the through hole of the dam portion to cover at least a portion of the dam portion; and (e) forming a conductive through via to extend through the upper conductive structure and the bonding layer, and contact the lower element.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
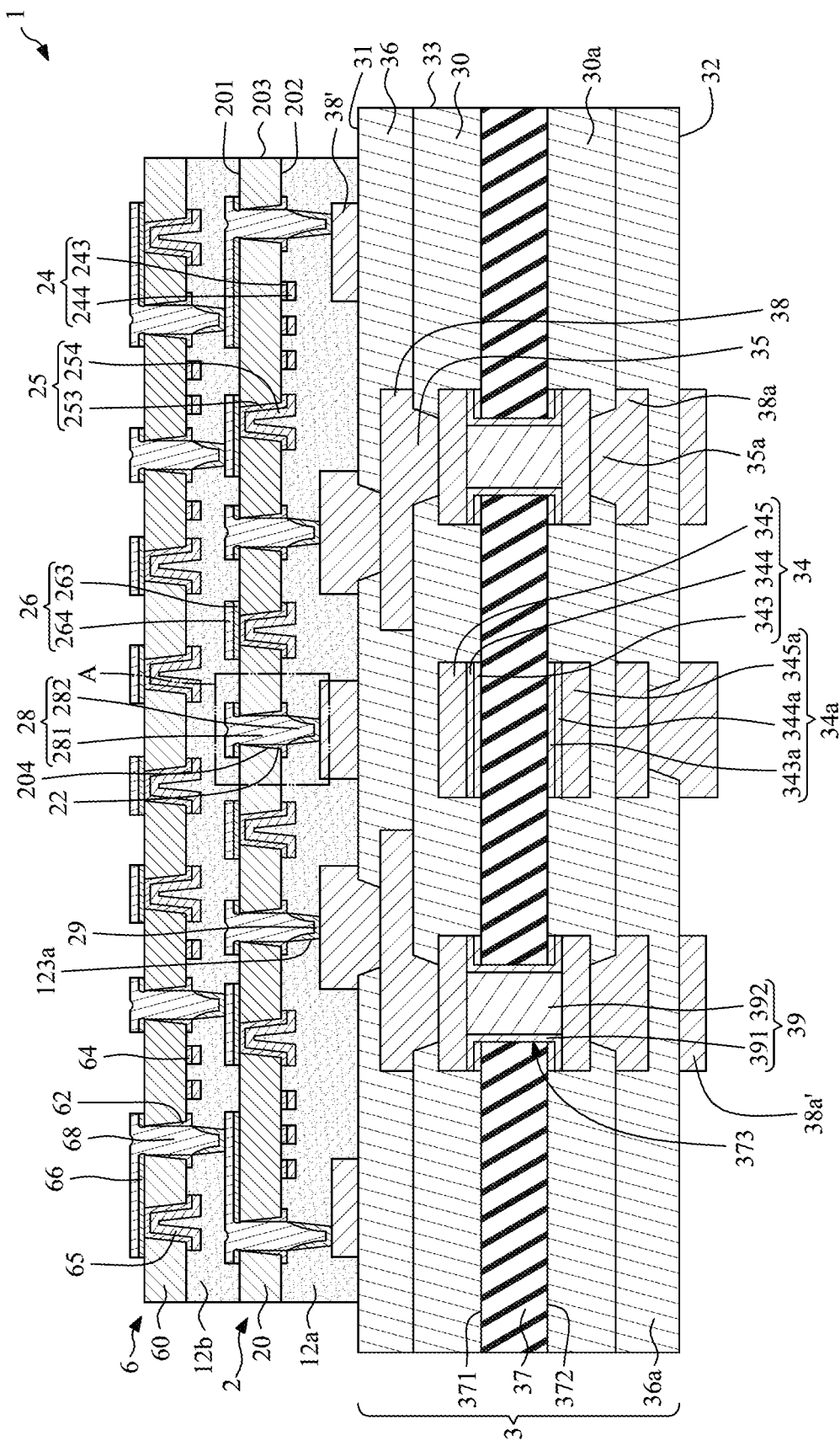
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
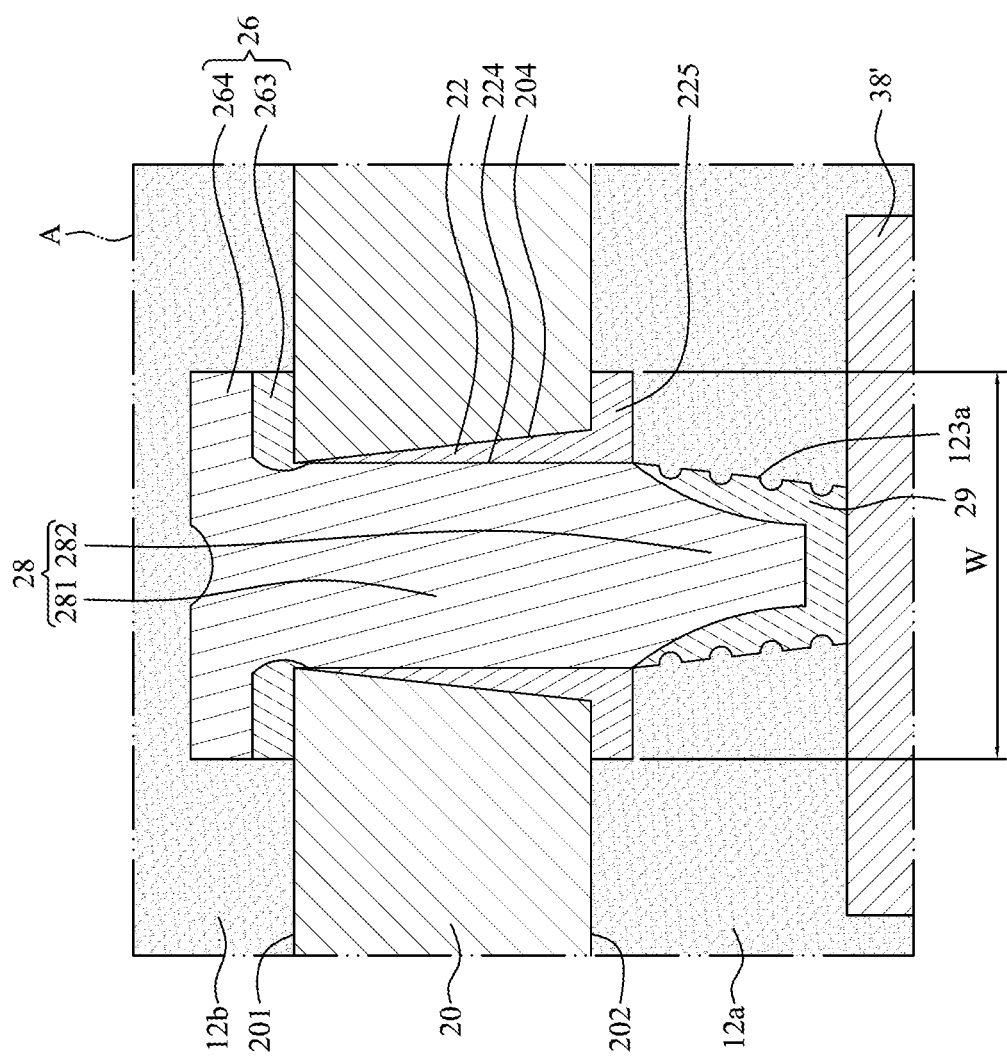
FIG. 2 illustrates a partially enlarged view of a region "A" in FIG. 1.

FIG. 1 illustrates a cross-sectional view of a wiring structure 1 according to some embodiments of the present disclosure. FIG. 2 illustrates a partially enlarged view of a region "A" in FIG. 1. The wiring structure 1 may include an upper conductive structure 2 (e.g., a conductive structure) and a plurality of conductive through vias 28. In some embodiments, the wiring structure 1 may further include a lower element 3, an additional upper conductive structure 6, a plurality of conductive through vias 68, a bonding layer 12a and an additional bonding layer 12b.

The upper conductive structure 2 is disposed on the lower element 3, and includes a dielectric layer 20, a least one circuit layer (including, for example, a lower circuit layer 24 formed of a metal, a metal alloy, or other conductive material) in contact with the dielectric layer 20, a plurality of dam portions 22, an outer circuit layer 26 (formed of a metal, a metal alloy, or other conductive material) in contact with the dielectric layer 20 and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layer (including, for example, the lower circuit layer 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The dielectric layer 20 may be a single layer, and has a top surface 201, a bottom surface 202 opposite to the top surface 201, and a lateral surface 203 extending between the top surface 201 and the bottom surface 202. It is noted that the top surface 201, the bottom surface 202 and the lateral surface 203 of the dielectric layer 20 may be a top surface, a bottom surface and a lateral surface of the upper conductive structure 2, respectively. In some embodiments, a material of the dielectric layer 20 is transparent, and can be seen through or detected by human eyes or machine. In some embodiments, a transparent material of the dielectric layer 20 has a light transmission for a wavelength in the visible range (or other pertinent wavelength for detection of a mark) of at least about 60%, at least about 70%, or at least about 80%. In some embodiments, a material of the dielectric layer 20 may be made of a cured photoimageable dielectric (PID) material such as epoxy or polyimide (PI) including photoinitiators.

The lower circuit layer 24 may be a fan-out circuit layer or redistribution layer (RDL), and an L/S of the circuit layer 24 may be less than about 10 µm/10 µm, less than or equal to 8 µm/8 µm, less than or equal to 5 µm/5 µm, less than or equal to 3 µm/3 µm, less than or equal to about 2 µm/about 2 µm, or less than or equal to about 1.8 µm/about 1.8 µm. In some embodiments, the lower circuit layer 24 is disposed adjacent to the bottom surface 202 of the dielectric layer 20. For example, the lower circuit layer 24 is disposed on and protrudes from the bottom surface 202 of the dielectric layer 20. In some embodiments, the lower circuit layer 24 may include a seed layer 243 and a conductive material 244 (e.g., a plating metallic material such as copper) disposed on the seed layer 243. As illustrated in the embodiment of FIG. 1, a horizontally connecting or extending circuit layer is omitted in the dielectric layer 20.

The inner conductive vias 25 may extend through the dielectric layer 20, and may be exposed from the top surface of the upper conductive structure 2 (e.g., the top surface 201 of the dielectric layer 20). In some embodiments, each inner conductive via 25 may include a seed layer 253 and a conductive material 254 (e.g., a plating metallic material such as copper) disposed on the seed layer 253. Each inner conductive via 25 tapers upwardly along a direction from the bottom surface 202 towards the top surface 201 of the dielectric layer 20. In some embodiments, the inner conductive vias 25 and the lower circuit layer 24 are formed concurrently. The seed layer 253 of the inner conductive via 25 and the seed layer 243 of the lower circuit layer 24 may be at the same layer, and the conductive material 254 of the inner conductive via 25 and the conductive material 244 of the lower circuit layer 24 may be at the same layer.

The dam portions 22 may extend through the dielectric layer 20. That is, each of the dam portions 22 may be disposed in a through hole 204 extending through the dielectric layer 20. In addition, each of the dam portions 22 may define a through hole 224. Thus, the dam portion 22 is in a substantially closed ring shape from a top view or a bottom view. As shown in FIG. 1 and FIG. 2, the dam portion 22 tapers upwardly along a direction from the bottom surface 202 towards the top surface 201 of the dielectric layer 20. However, the through hole 224 of the dam portion 22 has a substantially consistent width. That is, a width of a top portion of the dam portion 22 is less than a width of a bottom portion of the dam portion 22, and a width of a top portion of the through hole 224 of the dam portion 22 is substantially equal to a width of a bottom portion of the through hole 224 of the dam portion 22. Thus, a sidewall of the dam portion 22 tapers upwardly along a direction from the bottom surface 202 towards the top surface 201 of the dielectric layer 20. A width of a top portion of the sidewall of the dam portion 22 is less than a width of a bottom portion of the sidewall of the dam portion 22 from a cross-sectional view.

As shown in FIG. 2, the dam portion 22 may include an extending portion 225 disposed on a bottom surface 202 of the dielectric layer 20. In some embodiments, the dam portion 22 may be a plating auxiliary layer such as a seed layer. A material of the dam portion 22 may include titanium copper (TiCu), titanium tungsten copper (TiWCu) or other suitable material. In some embodiments, the dam portion 22, the seed layer 253 of the inner conductive via 25 and the seed layer 243 of the lower circuit layer 24 may be formed concurrently and may be at the same layer. The dam portion 22 may be electrically connected or physically connected to the seed layer 243 of the lower circuit layer 24.

The conductive through via 28 may extend through the dam portion 22 and the dielectric layer 20. The conductive through via 28 may include a first portion 281 and a second portion 282 under the first portion 281. The first portion 281 of the conductive through via 28 may be disposed in the through hole 224 of the dam portion 22. In some embodiments, the first portion 281 of the conductive through via 28 may fill and contact the through hole 224 of the dam portion 22. The first portion 281 of the conductive through via 28 in the through hole 224 of the dam portion 22 may have a substantially consistent width. The first portion 281 may not taper. Thus, a periphery side surface of the first portion 281 may be perpendicular to a surface (e.g., the top surface 201 or the bottom surface 202) of the dielectric layer 20. The second portion 282 of the conductive through via 28 may be disposed in the bonding layer 12*a* and may taper. In some embodiments, the conductive through via 28 may include copper formed by plating. In some embodiments, the first portion 281 and the second portion 282 are formed integrally as a monolithic or one-piece structure. The conductive through via 28 may be electrically connected to the seed layer 243 of the lower circuit layer 24 through the dam portion 22.

The outer circuit layer 26 is disposed on the top surface 201 of the dielectric layer 20. In some embodiments, the outer circuit layer 26 and the conductive through vias 28 may be formed integrally and concurrently. In addition, the lower circuit layer 24 may be electrically connected to the outer circuit layer 26 through the inner conductive via 25. As shown in FIG. 1, the outer circuit layer 26 may contact the inner conductive via 25. In some embodiments, the outer circuit layer 26 may include an outer metal layer 263 and an outer conductive material 264 (e.g., a plating metallic material such as copper) disposed on the outer metal layer 263. The outer metal layer 263 is disposed adjacent to or disposed on the top surface 201 of the dielectric layer 20. In some embodiments, the outer metal layer 263 may extend into the through hole 224 of the dam portion 22, and cover a top portion of the dam portion 22. In some embodiments, the outer metal layer 263 may be a plating auxiliary layer such as a seed layer. A material of the outer metal layer 263 may include titanium copper (TiCu), titanium tungsten copper (TiWCu) or other suitable material. That is, the dam portion 22 and the outer metal layer 263 may be both seed layers, and their materials may be same as or different from each other. In some embodiments, the outer conductive material 264 and the conductive through vias 28 may be formed integrally and concurrently.

The lower element 3 may be a conductive structure that includes at least one dielectric layer (including, for example, one first upper dielectric layer 30, one second upper dielectric layer 36, one first lower dielectric layer 30*a* and one second lower dielectric layer 36*a*) and at least one circuit layer (including, for example, one first upper circuit layer 34, two second upper circuit layers 38, 38', one first lower circuit layer 34*a* and two second lower circuit layers 38*a*, 38*a*' formed of a metal, a metal alloy, or other conductive material) in contact with the dielectric layer (e.g., the first upper dielectric layer 30, the second upper dielectric layer 36, the first lower dielectric layer 30*a* and the second lower dielectric layer 36*a*). In some embodiments, the lower element 3 may be similar to a core substrate that further includes a core portion 37. The lower element 3 may be also referred to as "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower element 3 may be also referred to as "a low-density circuit layer". As shown in FIG. 1, the lower element 3 has a top surface 31, a bottom surface 32 opposite to the top surface 31, and a lateral surface 33 extending between the top surface 31 and the bottom surface 32. The lower element 3 may include a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 1, the lateral surface 203 of the upper conductive structure 2 may be displaced or recessed from the lateral surface 33 of the lower element 3.

The core portion 37 has a top surface 371 and a bottom surface 372 opposite to the top surface 371, and defines a plurality of through holes 373 extending through the core portion 37. An interconnection via 39 is disposed or formed in each through holes 373 for vertical connection. In some embodiments, the interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit the insulation material 392, and may include a bulk metallic material that fills the through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30a is disposed on the bottom surface 372 of the core portion 37. The second lower dielectric layer 36a is stacked or disposed on the first lower dielectric layer 30a.

A thickness of the dielectric layer 20 of the upper conductive structure 2 is less than or equal to about 40%, less than or equal to about 35%, or less than or equal to about 30% of a thickness of each of the dielectric layers 30, 36, 30a, 36a of the lower element 3. For example, a thickness of each of the dielectric layer 20 of the upper conductive structure 2 may be less than or equal to about 7 and a thickness of each of the dielectric layers 30, 36, 30a, 36a of the lower element 3 may be about 40 μm. In addition, a material of the dielectric layers 30, 36, 30a, 36a of the lower element 3 may be different from the material of the dielectric layer 20 of the upper conductive structure 2. For example, the material of the dielectric layers 30, 36, 30a, 36a of the lower element 3 may be polypropylene (PP) or ajinomoto build-up film (ABF).

An L/S of the first upper circuit layer 34 may be greater than or equal to about 10 μm/about 10 μm. Thus, the L/S of the first upper circuit layer 34 may be greater than or equal to about five times the L/S of the lower circuit layer 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the lower circuit layers 24 of the upper conductive structure 2. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower element 3.

In addition, in some embodiments, the second upper circuit layer 38' is disposed on and protrudes from the top surface of the second upper dielectric layer 36. In some embodiments, the second upper circuit layer 38 is electrically connected to the second upper circuit layer 38' through the upper interconnection vias 35. In some embodiments, the second upper circuit layer 38' is the topmost circuit layer of the lower element 3.

An L/S of the first lower circuit layer 34a may be greater than or equal to about 10 μm/about 10 μm. Thus, the L/S of the first lower circuit layer 34a may be greater than or equal to about five times the L/S of the lower circuit layer 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the lower circuit layer 24 of the upper conductive structure 2. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower element 3.

In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' is the bottommost low-density circuit layer of the lower element 3. In some embodiments, each of the circuit layers (for example, the first upper circuit layer 34, the two second upper circuit layers 38, 38', the first lower circuit layer 34a and the two second lower circuit layers 38a, 38a') of the lower element 3 may not have a consistent thickness.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The bonding layer 12a is interposed or disposed between the upper conductive structure 2 and the lower element 3 to bond the upper conductive structure 2 and the lower element 3 together. That is, the bonding layer 12a adheres to the bottom surface 202 of the upper conductive structure 2 and the top surface 31 of the lower element 3. In some embodiments, the bonding layer 12a may be an adhesion layer that is cured from an adhesive material (e.g., includes a cured adhesive material such as an adhesive polymeric material). Thus, the lower circuit layer 24 of the upper conductive structure 2 and the topmost circuit layer (e.g., the second upper circuit layer 38') of the lower element 3 are embedded in the bonding layer 12a.

In some embodiments, a material of the bonding layer 12a is transparent, and can be seen through by human eyes or machine. In addition, the material of the bonding layer 12a may be different from the material of the dielectric layers 30, 36, 30a, 36a of the lower element 3 and the material of the dielectric layer 20 of the upper conductive structure 2. For example, the material of the bonding layer 12a may be ABF, or ABF-like dielectric film.

The bonding layer 12a defines at least one through hole 123a corresponding to the through hole 224 of the dam portion 22. In some embodiments, the through hole 123a extends through the bonding layer 12a and terminates at or on a topmost circuit layer (e.g., the second upper circuit layer 38') of the lower element 3. In some embodiments, the sidewall of the through hole 123a of the bonding layer 12a may be rough and/or curved since it may be formed by plasma. The through hole 123a of the bonding layer 12a may expose a portion of the topmost circuit layer (e.g., a top surface of the second upper circuit layer 38') of the lower element 3.

As shown in FIG. 2, the through hole 123a of the bonding layer 12a may be aligned with and in communication with the through hole 224 of the dam portion 22 for accommodating the conductive through via 28. Thus, the second portion 282 of the conductive through via 28 may be disposed in the through hole 123a of the bonding layer 12a to electrically connect the topmost circuit layer (e.g., the top surface of the second upper circuit layer 38') of the lower element 3. The second portion 282 of the conductive through via 28 may taper downwardly along a direction from a top surface towards a bottom surface of the bonding layer 12a. The conductive through via 28 extends from the top surface 201 of the upper conductive structure 2 to the bottom surface of the bonding layer 12a to terminate at or on a portion of the topmost circuit layer (e.g., the top surface of the second upper circuit layer 38') of the lower element 3. Thus, a length of the conductive through via 28 is greater than a thickness of the upper conductive structure 2. In some embodiments, the lower circuit layer 24 of the upper conductive structure 2 is electrically connected to the lower element 3 only through the conductive through via 28.

In some embodiments, a lower metal layer 29 may be further included to be interposed between the second portion 282 of the conductive through via 28 and the through hole 123a of the bonding layer 12a. The lower metal layer 29 may be disposed on an inner surface of the through hole 123a of the bonding layer 12a, and the conductive through via 28 is disposed on the lower metal layer 29. In some embodiments, the lower metal layer 29 may be a plating auxiliary layer such as a seed layer. A material of the lower metal layer 29 may include titanium copper (TiCu), titanium tungsten copper (TiWCu) or other suitable material. That is, the lower metal layer 29 and the outer metal layer 263 may be both seed layers, and their materials may be same as or different from each other. In some embodiments, the outer conductive material 264 and the lower metal layer 29 may be formed concurrently at a same stage; however, they may not connect each other.

As shown in FIG. 1, the additional upper conductive structure 6 is attached to the upper conductive structure through an additional bonding layer 12b, and includes a dielectric layer 60, a least one circuit layer (including, for example, a lower circuit layer 64) in contact with the dielectric layer 60, a plurality of dam portions 62, an outer circuit layer 66 in contact with the dielectric layer 60 and a plurality of inner conductive vias 65. In some embodiments, the additional upper conductive structure 6 may be similar to the upper conductive structure 2. That is, the dielectric layer 60, the lower circuit layer 64, the dam portions 62, the outer circuit layer 66 and the inner conductive vias 65 of the additional upper conductive structure 6 may be similar to the dielectric layer 20, the lower circuit layer 24, the dam portions 22, the outer circuit layer 26 and the inner conductive vias 25 of the upper conductive structure 2, respectively. In addition, the conductive through via 68 may be similar to the conductive through via 28. The conductive through via 68 extends from the top surface of the additional upper conductive structure 6 to the bottom surface of the additional bonding layer 12b to terminate at or on a portion of the outer circuit layer 26 of the upper conductive structure 2. Thus, the outer circuit layer 66 of the additional upper conductive structure 6 may be electrically connected to the outer circuit layer 26 of the upper conductive structure 2 through the conductive through via 68.

As shown in the embodiment illustrated in FIG. 1 and FIG. 2, the wiring structure 1 is a combination of the upper conductive structure 2, the additional upper conductive structure 6 and the lower element 3, in which the circuit layers 24, 64 of the upper conductive structure 2 and the additional upper conductive structure 6 have fine pitch, high yield and low thickness; and the circuit layers (for example, the first upper circuit layer 34, the second upper circuit layers 38, 38', the first lower circuit layer 34a and the second lower circuit layers 38a, 38a') of the lower element 3 have low manufacturing cost. Thus, the wiring structure 1 has an advantageous compromise of yield and manufacturing cost, and the wiring structure 1 has a relatively low thickness. The manufacturing yield for one layer of the circuit layers 24, 64 of the upper conductive structure 2 and the additional upper conductive structure 6 may be 99%, and the manufacturing yield for one layer of the circuit layers (for example, the first upper circuit layer 34, the second upper circuit layers 38, 38', the first lower circuit layer 34a and the second lower circuit layers 38a, 38a') of the lower element 3 may be 90%. Thus, the yield of the wiring structure 1 may be improved. In addition, the warpage of the upper conductive structure 2, the additional upper conductive structure 6 and the warpage of the lower element 3 are separated and will not influence each other. Thus, the warpage of the lower element 3 will not be accumulated onto the warpage of the upper conductive structure 2 and the additional upper conductive structure 6. Thus, the yield of the wiring structure 1 may be further improved.

As shown in FIG. 2, since the conductive through via 28 is defined and limited by the solid portion of the dam portion 22, a maximum width of the conductive through via 28 and the dam portion 22 is equal to the maximum width W of the dam portion 22. In some embodiments, the maximum width W of the dam portion 22 may be less than 50 μm, less than 20 μm, or less than 10 μm. Accordingly, the width of the conductive through via 28 may be relatively small, and the conductive through via 28 may not have a barrel shape.

Figure 3:
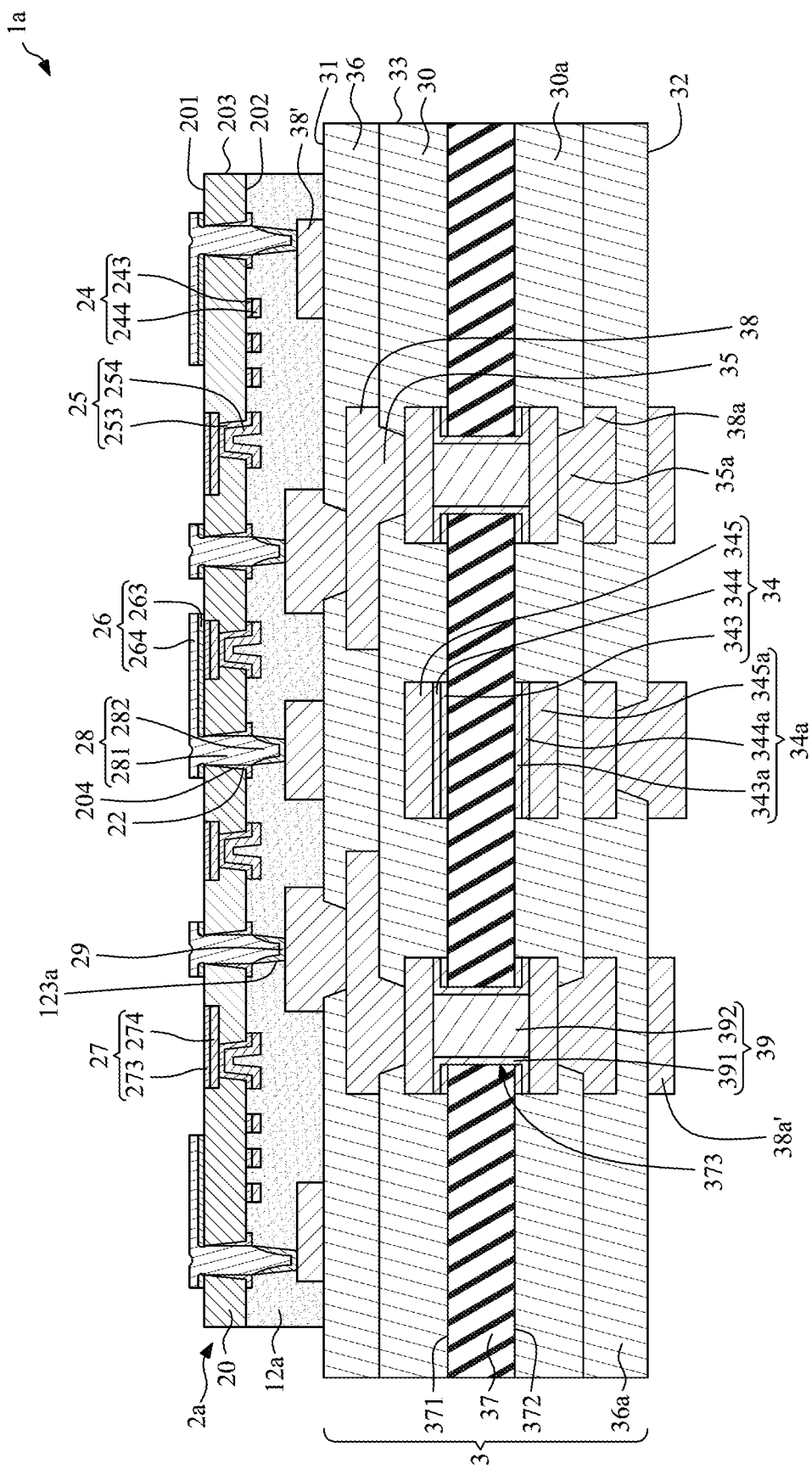
FIG. 3 illustrates a cross-sectional view of a wiring structure according to some embodiments of the present disclosure.

FIG. 3 illustrates a cross-sectional view of a wiring structure 1a according to some embodiments of the present disclosure. The wiring structure 1a is similar to the wiring structure 1 shown in FIG. 1, except that the additional upper conductive structure 6 and the additional bonding layer 12b are omitted, and the circuit layer of the upper conductive structure 2a further includes an upper circuit layer 27 disposed adjacent to the top surface 201 of the dielectric layer 20. As shown in FIG. 3, the upper circuit layer 27 is embedded in the dielectric layer 20 and exposed from the top surface 201 of the dielectric layer 20. The outer circuit layer 26 may cover and contact the upper circuit layer 27. Thus, the outer circuit layer 26 may electrically connect the conductive through vias 28 and the upper circuit layer 27. In addition, the inner conductive via 25 may contact the upper circuit layer 27. Thus, the lower circuit layer 24 may be electrically connected to the upper circuit layer 27 through the inner conductive via 25.

Figure 4:
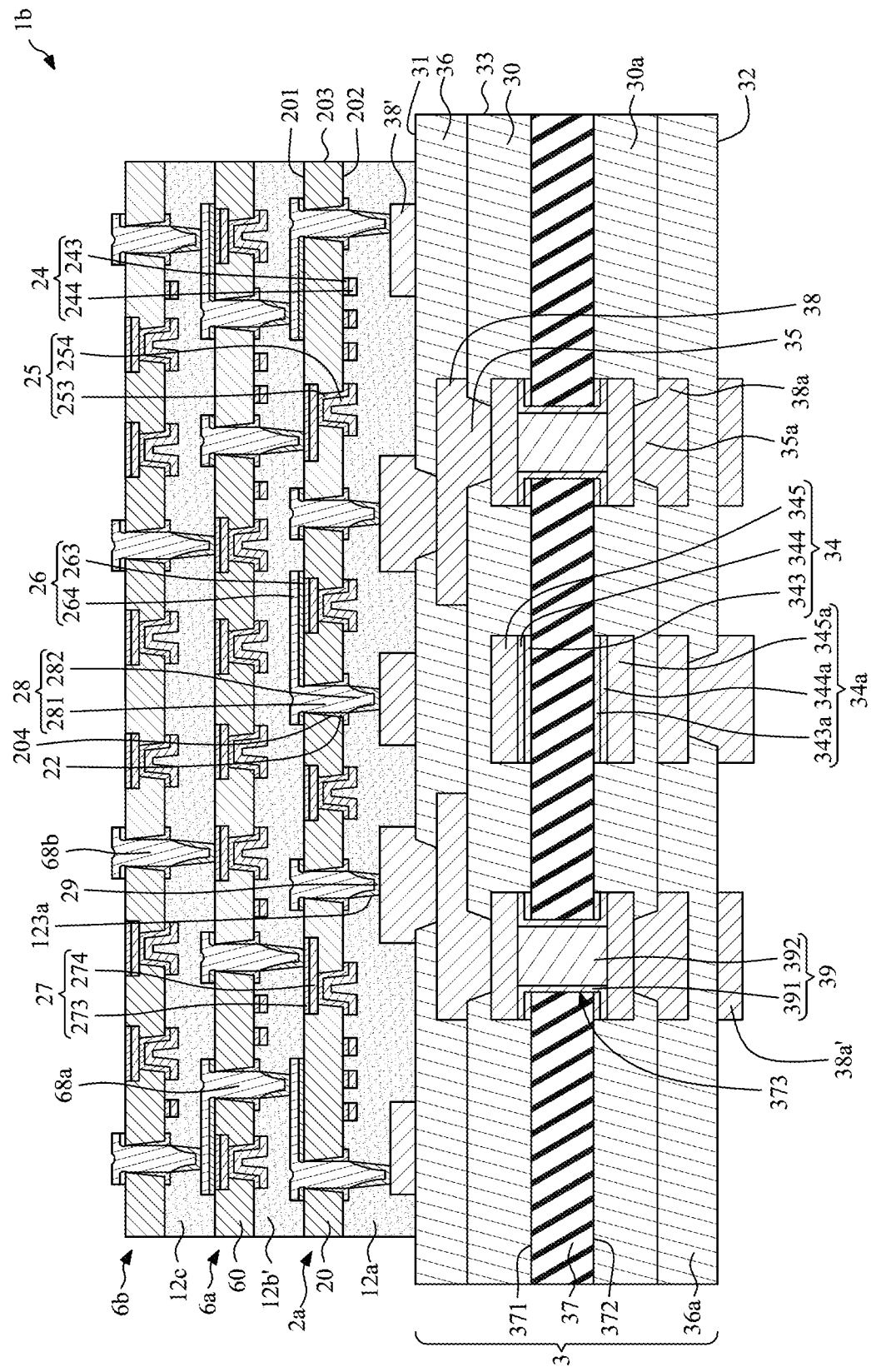
FIG. 4 illustrates a cross-sectional view of a wiring structure according to some embodiments of the present disclosure.

FIG. 4 illustrates a cross-sectional view of a wiring structure 1b according to some embodiments of the present disclosure. The wiring structure 1b is similar to the wiring structure 1a shown in FIG. 3, except that two additional upper conductive structures 6a, 6b are further included. The additional upper conductive structure 6a is similar to the upper conductive structure 2a, and is attached to the upper conductive structure 2a through a bonding layer 12b'. The additional upper conductive structure 6a is electrically connected to the upper conductive structure 2a through a plurality of conductive through vias 68a. The additional upper conductive structure 6b is similar to the upper conductive structure 2a, and is attached to the additional upper conductive structure 6a through a bonding layer 12c. The additional upper conductive structure 6b is electrically connected to the additional upper conductive structure 6a through a plurality of conductive through vias 68b.

Figure 5:
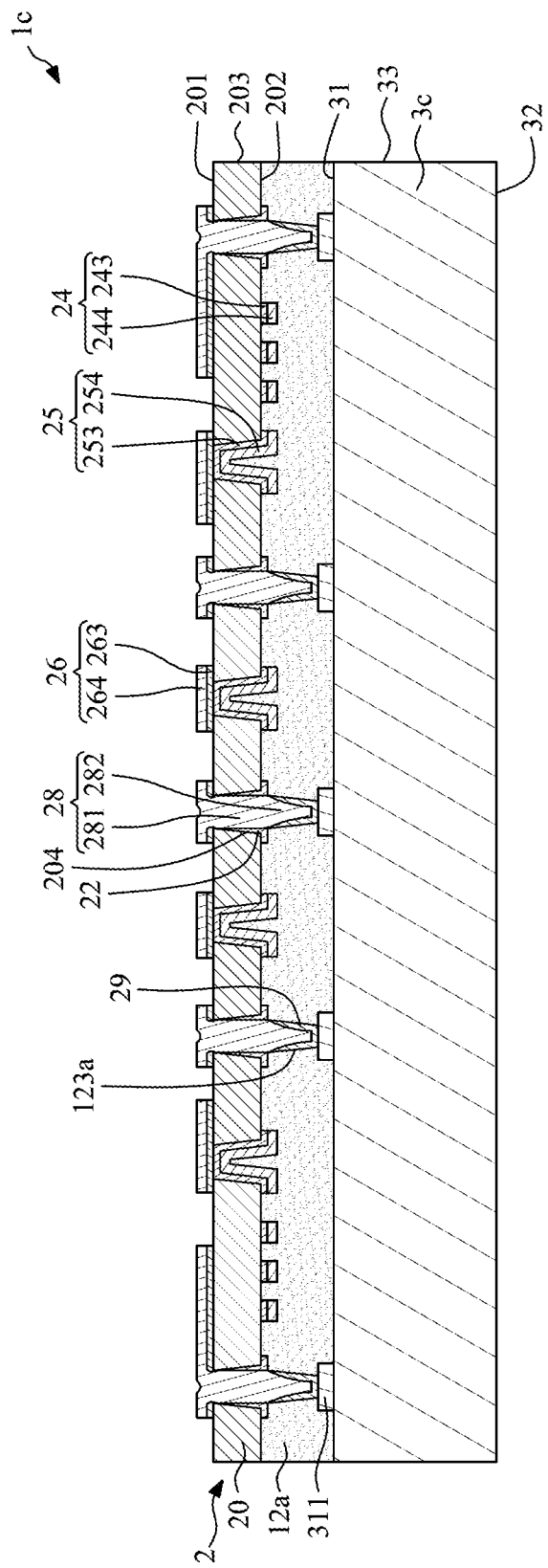
FIG. 5 illustrates a cross-sectional view of a wiring structure according to some embodiments of the present disclosure.

FIG. 5 illustrates a cross-sectional view of a wiring structure 1c according to some embodiments of the present disclosure. The wiring structure 1c is similar to the wiring structure 1 shown in FIG. 1, except that the additional upper conductive structure 6 and the additional bonding layer 12b are omitted, and the lower element 3 is replaced by a lower element 3c. As shown in FIG. 5, the lower element 3c may be a semiconductor chip or a semiconductor die, and may have a top surface 31, a bottom surface 32 opposite to the top surface 31, and a lateral surface 33 extending between the top surface 31 and the bottom surface 32. The lateral surface 33 of the lower element 3c may be substantially coplanar with the lateral surface 203 of the upper conductive structure 2 since they are singulated concurrently. The lower element 3c may include a plurality of pads 311 disposed adjacent to the top surface 31. The conductive through via 28 terminates on the pad 311 of the lower element 3c. Thus, the outer circuit layer 26 and/or the lower circuit layer 24 may be electrically connected to the lower element 3c through the conductive through via 28 and the pad 311.

Figure 6:
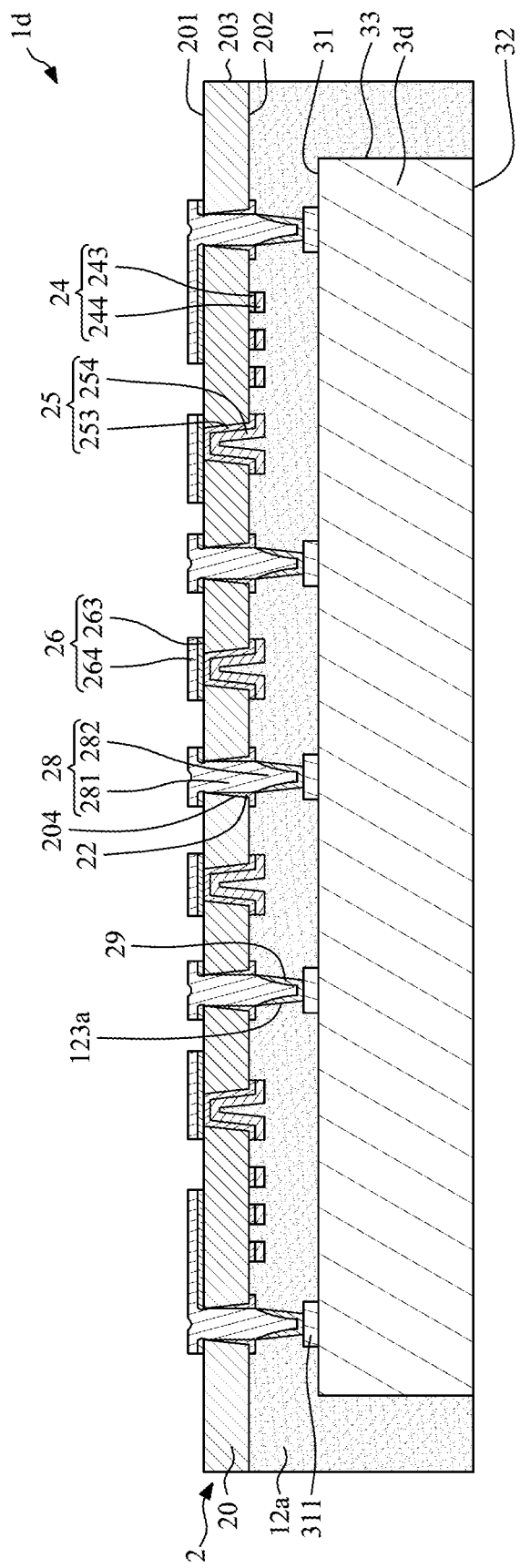
FIG. 6 illustrates a cross-sectional view of a wiring structure according to some embodiments of the present disclosure.

FIG. 6 illustrates a cross-sectional view of a wiring structure 1d according to some embodiments of the present disclosure. The wiring structure 1d is similar to the wiring structure 1c shown in FIG. 5, except a structure of the lower element 3d. As shown in FIG. 6, the lower element 3d may be a semiconductor chip or a semiconductor die, and may have a top surface 31, a bottom surface 32 opposite to the top surface 31, and a lateral surface 33 extending between the top surface 31 and the bottom surface 32. The bonding layer 12a may cover the lateral surface 33 of the lower element 3d.

Figure 7:
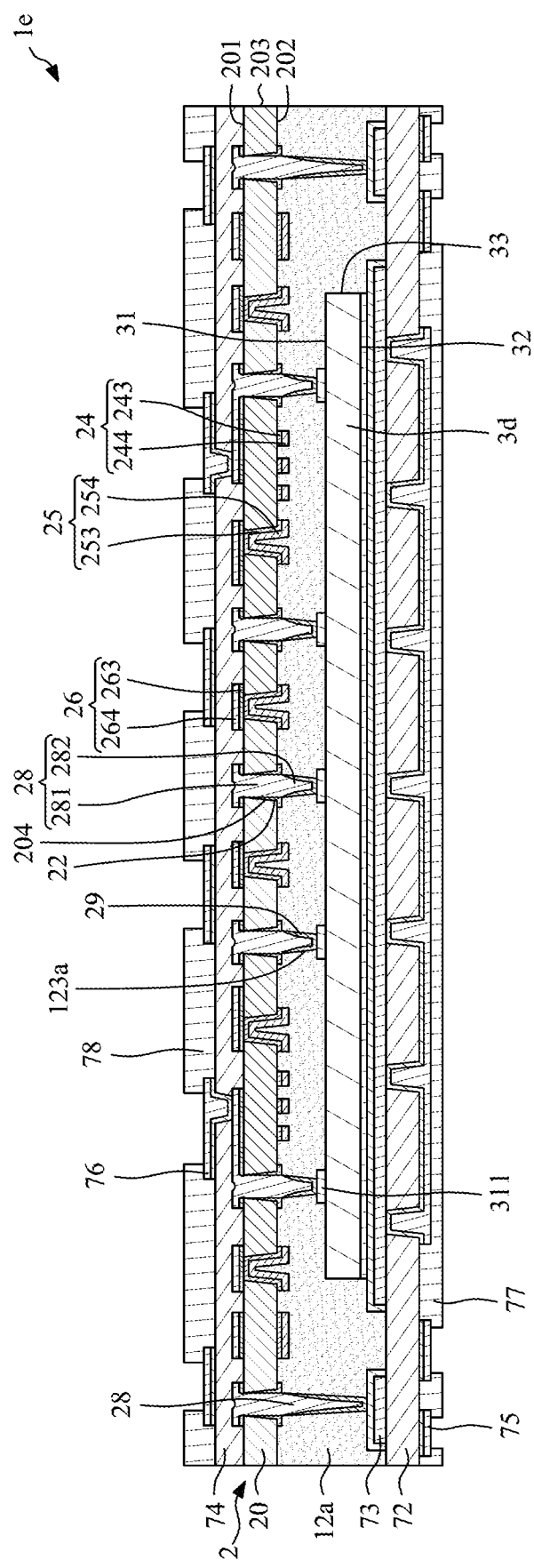
FIG. 7 illustrates a cross-sectional view of a wiring structure according to some embodiments of the present disclosure.

FIG. 7 illustrates a cross-sectional view of a wiring structure 1e according to some embodiments of the present disclosure. The wiring structure 1e is similar to the wiring structure 1d shown in FIG. 6, except that a bottom dielectric layer 72, an intermediate circuit layer 73, a top dielectric layer 74, a bottom circuit layer 75, a top circuit layer 76, a bottom protection layer 77 and a top protection layer 78 are further included. The intermediate circuit layer 73 may be disposed adjacent to a bottom surface of the bonding layer 12a. For example, the intermediate circuit layer 73 may be embedded in the bonding layer 12a, and exposed from the bottom surface of the bonding layer 12a. Alternatively, the intermediate circuit layer 73 may be embedded in the bottom dielectric layer 72, and exposed from the top surface of the bottom dielectric layer 72. The lower element 3d may be attached to the intermediate circuit layer 73. The bonding layer 12a may be disposed in a space between the bottom dielectric layer 72 and the upper conductive structure 2 to cover the lower element 3d and the intermediate circuit layer 73. Some of the conductive through vias 28 are disposed above the lower element 3d to electrically connect the outer circuit layer 26 and/or the lower circuit layer 24 of the upper conductive structure 2 and the lower element 3d. The other conductive through vias 28 are disposed around the lower element 3d to electrically connect the outer circuit layer 26 and/or the lower circuit layer 24 of the upper conductive structure 2 and the intermediate circuit layer 73. The top dielectric layer 74 is disposed on the upper conductive structure 2. The top circuit layer 76 is disposed on the top dielectric layer 74, and is electrically connected to the outer circuit layer 26 of the upper conductive structure 2. The top protection layer 78 (e.g., a solder mask layer) is disposed on the top dielectric layer 74, and defines a plurality of openings to expose portions of the top circuit layer 76. The bottom dielectric layer 72 is disposed on the bottom surface of the bonding layer 12a. The bottom circuit layer 75 is disposed on the bottom dielectric layer 72, and is electrically connected to the intermediate circuit layer 73. The bottom protection layer 77 (e.g., a solder mask layer) is disposed on the bottom dielectric layer 72, and defines a plurality of openings to expose portions of the bottom circuit layer 75.

Figure 8:
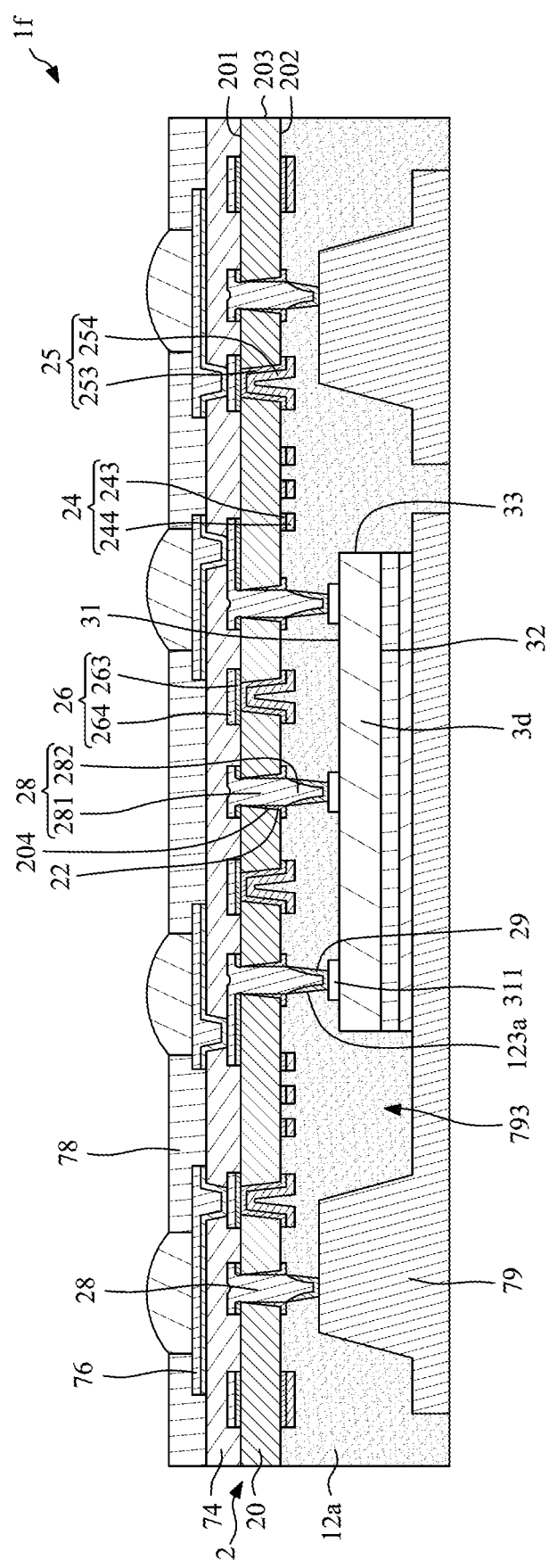
FIG. 8 illustrates a cross-sectional view of a wiring structure according to some embodiments of the present disclosure.

FIG. 8 illustrates a cross-sectional view of a wiring structure 1f according to some embodiments of the present disclosure. The wiring structure 1f is similar to the wiring structure 1e shown in FIG. 7, except that the bottom dielectric layer 72, the intermediate circuit layer 73, the bottom circuit layer 75 and the bottom protection layer 77 are replaced by a metal carrier 79. As shown in FIG. 8, the metal carrier 79 defines a cavity 793. The lower element 3d may be attached to the metal carrier 79 in the cavity 793. The bonding layer 12a may be disposed in a space between the metal carrier 79 and the upper conductive structure 2 to cover the lower element 3d. Some of the conductive through vias 28 are disposed above the lower element 3d to electrically connect the outer circuit layer 26 and/or the lower circuit layer 24 of the upper conductive structure 2 and the lower element 3d. The other conductive through vias 28 are disposed around the lower element 3d to electrically connect the outer circuit layer 26 and/or the lower circuit layer 24 of the upper conductive structure 2 and the metal carrier 79.

Figure 9:
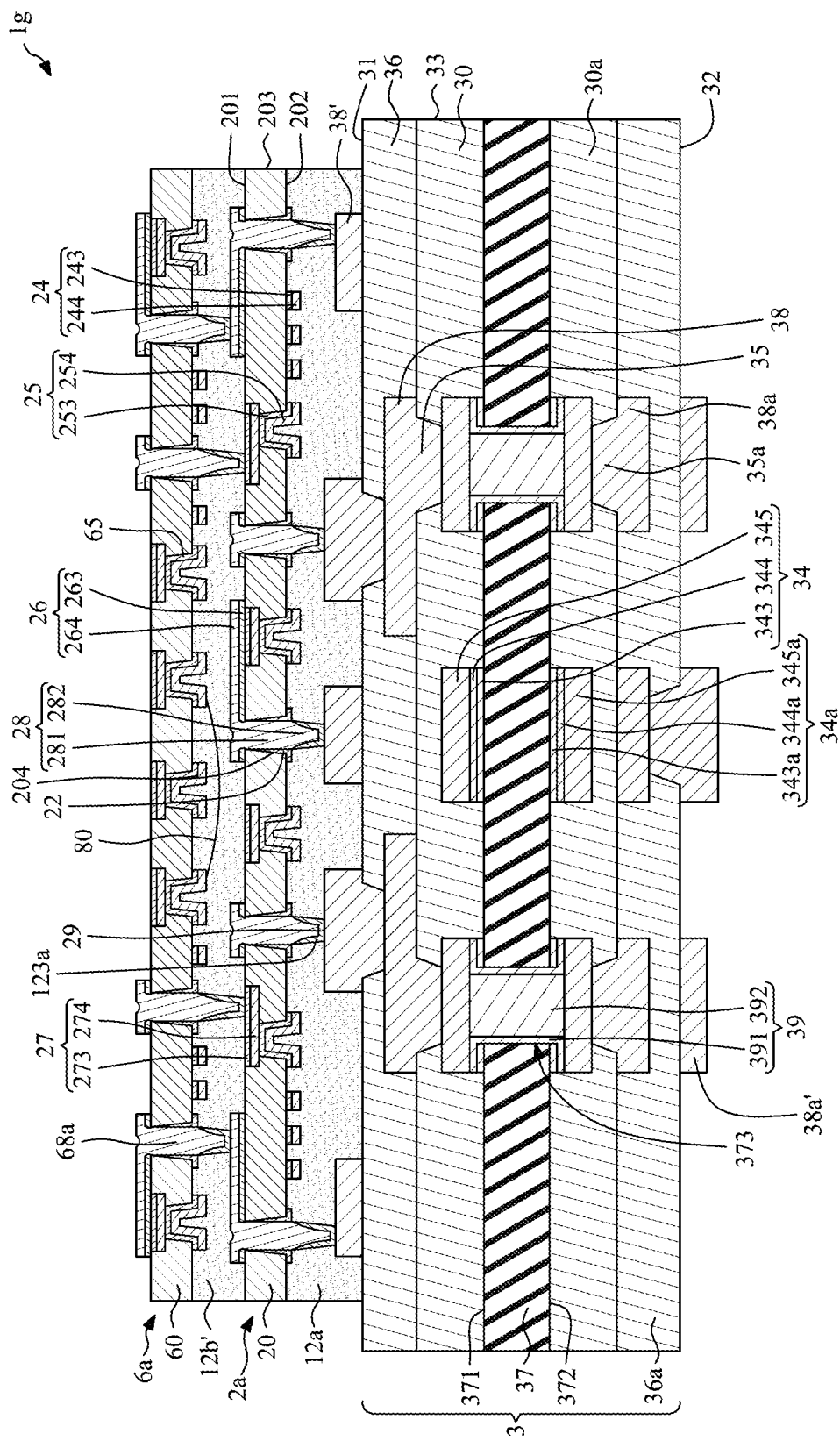
FIG. 9 illustrates a cross-sectional view of a wiring structure according to some embodiments of the present disclosure.

FIG. 9 illustrates a cross-sectional view of a wiring structure 1g according to some embodiments of the present disclosure. The wiring structure 1g is similar to the wiring structure 1b shown in FIG. 4, except that the additional upper conductive structures 6b and the bonding layer 12c are omitted, and the additional upper conductive structures 6a further includes at least one bonding wire 80 for electrically connecting two of the inner conductive vias 65.

Figure 10:
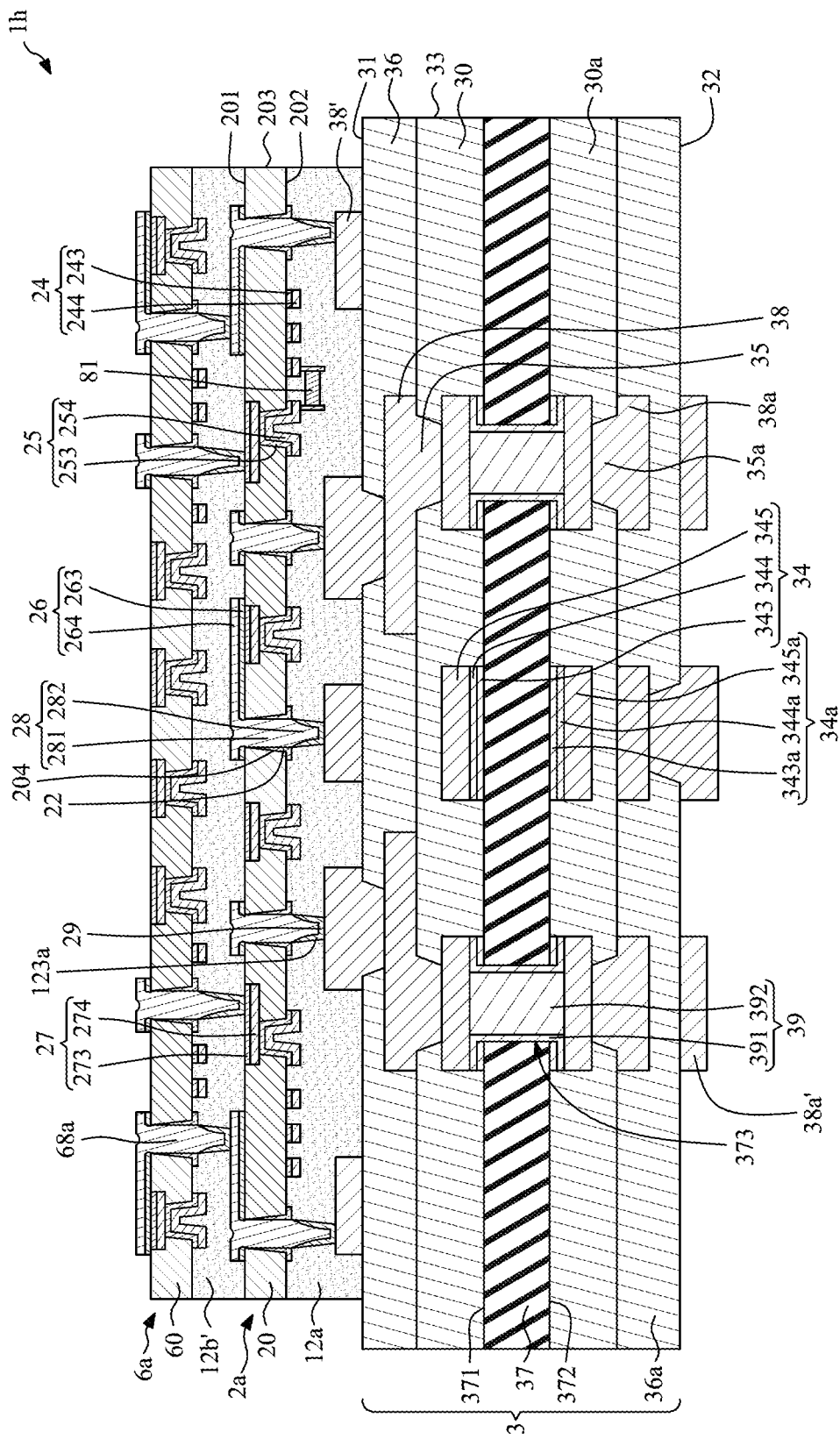
FIG. 10 illustrates a cross-sectional view of a wiring structure according to some embodiments of the present disclosure.

FIG. 10 illustrates a cross-sectional view of a wiring structure 1g according to some embodiments of the present disclosure. The wiring structure 1g is similar to the wiring structure 1b shown in FIG. 4, except that the additional upper conductive structures 6b and the bonding layer 12c are omitted, and the upper conductive structures 2a further includes at least one electronic element 81 (e.g., a passive element) disposed on and electrically connected to the lower circuit layer 24.

Figure 11:
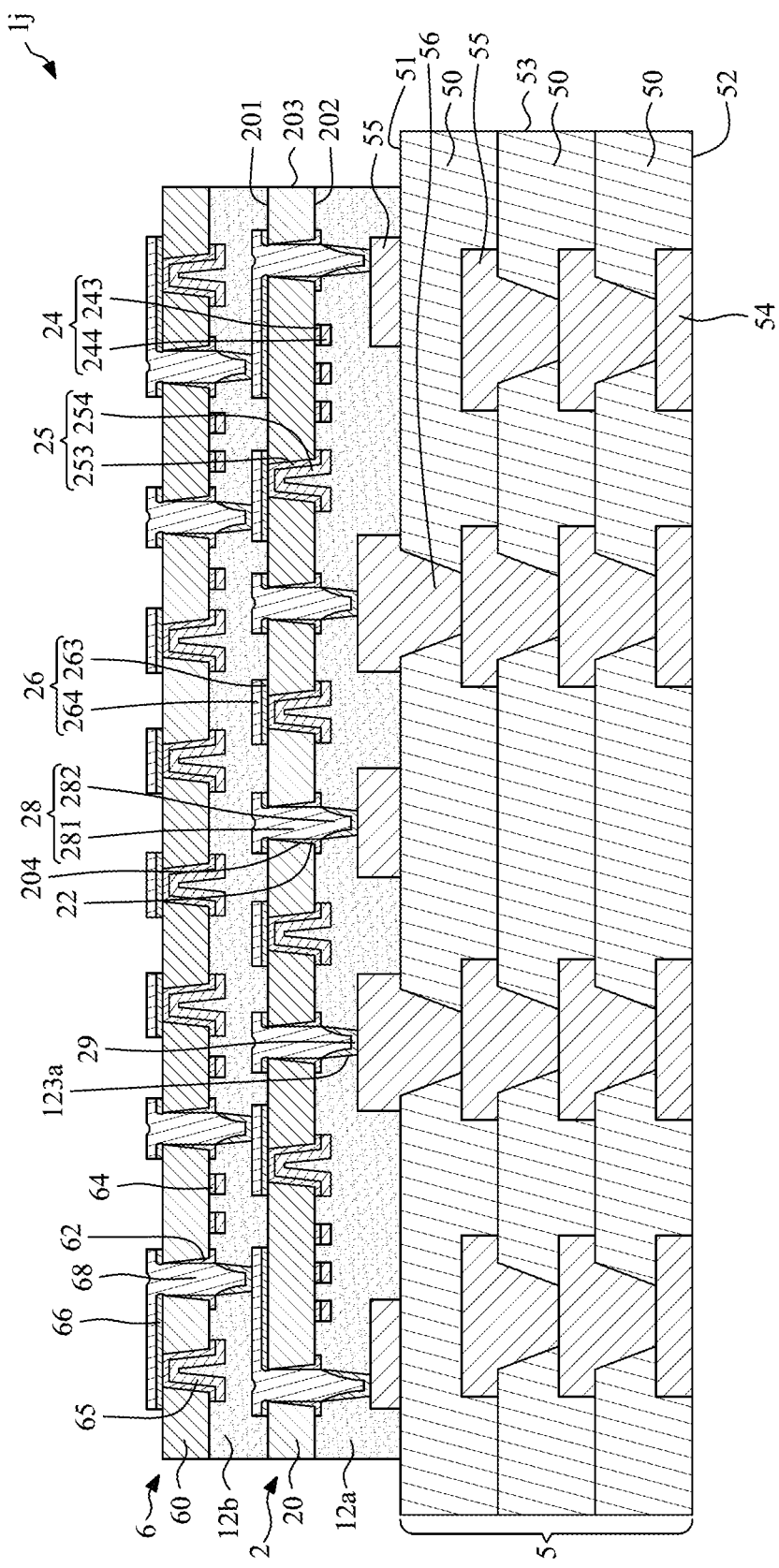
FIG. 11 illustrates a cross-sectional view of a wiring structure according to some embodiments of the present disclosure.

FIG. 11 illustrates a cross-sectional view of a wiring structure 1j according to some embodiments of the present disclosure. The wiring structure 1j is similar to the wiring structure 1 shown in FIG. 1, except for a structure of the lower element 5. As shown in FIG. 11, the lower element 5 may be a coreless substrate, and may include at least one dielectric layer (including, for example, three dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). As shown in FIG. 11, the lower element 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower element 5. In some embodiments, the lateral surface 23 of the upper conductive structure 2 may be substantially coplanar with the lateral surface 53 of the lower element 5.

The lower circuit layer 54 is embedded in the bottommost dielectric layer 50, and exposed from the bottom surface of the bottommost dielectric layer 50. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower element 5. Thus, a tapering direction of the inner conductive via 56 of the lower element 5 is different from the tapering direction of the inner conductive via 25 of the upper conductive structure 2.

A thickness of the dielectric layer 20 of the upper conductive structure 2 is less than or equal to about 40%, less than or equal to about 35%, or less than or equal to about 30% of a thickness of each of the dielectric layers 50 of the lower element 5. In addition, a material of the dielectric layers 50 of the lower element 5 may be different from the material of the dielectric layer 20 of the upper conductive structure 2. For example, the material of the dielectric layers 50 of the lower element 5 may be polypropylene (PP) or ajinomoto build-up film (ABF).

An L/S of the upper circuit layer 55 and the lower circuit layer 54 may be greater than or equal to about 10 μm/about 10 μm. Thus, the L/S of the upper circuit layer 55 and the lower circuit layer 54 may be greater than or equal to about five times the L/S of the lower circuit layer 24 of the upper conductive structure 2. In addition, in some embodiments, the topmost upper circuit layer 55 is disposed on and protrudes from the top surface of the topmost dielectric layer 50 (i.e., the top surface 51 of the lower element 5).

The bonding layer 12a is interposed or disposed between the upper conductive structure 2 and the lower element 5 to bond the upper conductive structure 2 and the lower element 5 together. In addition, the material of the bonding layer 12a may be different from the material of the dielectric layers 50 the lower element 5. The conductive through via 28 may extend through the upper conductive structure 2 and the bonding layer 12a, and is electrically connected to the topmost upper circuit layer 55 of the lower element 5.

Figure 12:
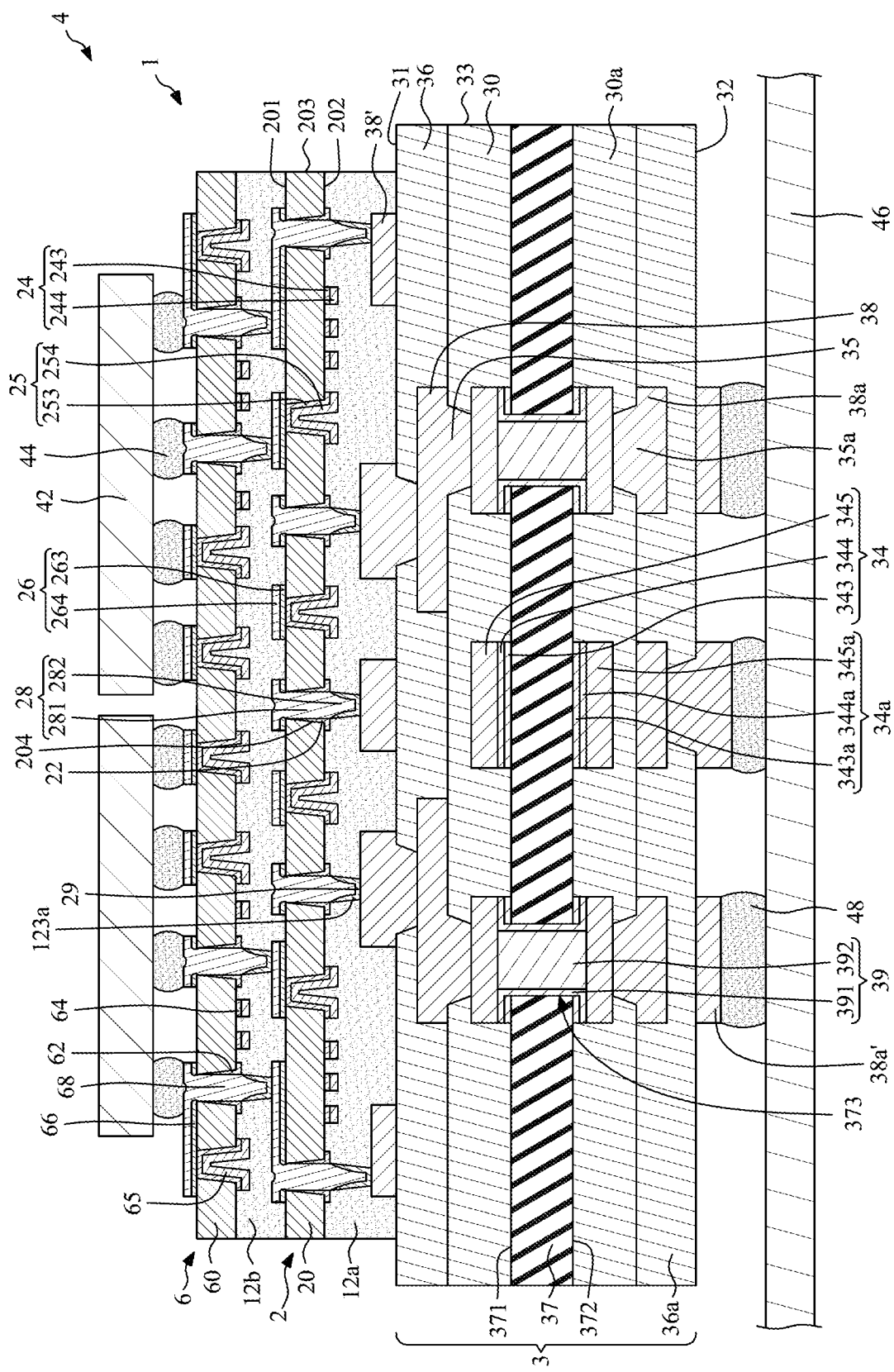
FIG. 12 illustrates a cross-sectional view of a bonding of a package structure and a substrate according to some embodiments of the present disclosure.

FIG. 12 illustrates a cross-sectional view of a bonding of a package structure 4 and a substrate 46 according to some embodiments. The package structure 4 includes a wiring structure 1, a semiconductor chip 42, a plurality of first connecting elements 44 and a plurality of second connecting elements 48. The wiring structure 1 of FIG. 12 is similar to the wiring structure 1 shown in FIG. 1. The semiconductor chip 42 is electrically connected and bonded to the outer circuit layer 26 of the upper conductive structure 2 through the first connecting elements 44 (e.g., solder bumps or other conductive bumps). The second lower circuit layer 38a' of the lower element 3 is electrically connected and bonded to the substrate 46 (e.g., a mother board such as a printed circuit board (PCB)) through the second connecting elements 48 (e.g., solder bumps or other conductive bumps).

FIG. 13 through FIG. 33 illustrate a method for manufacturing a wiring structure according to some embodiments of the present disclosure. In some embodiments, the method is for manufacturing the wiring structure 1*a* shown in FIG. 3.

Figure 13:
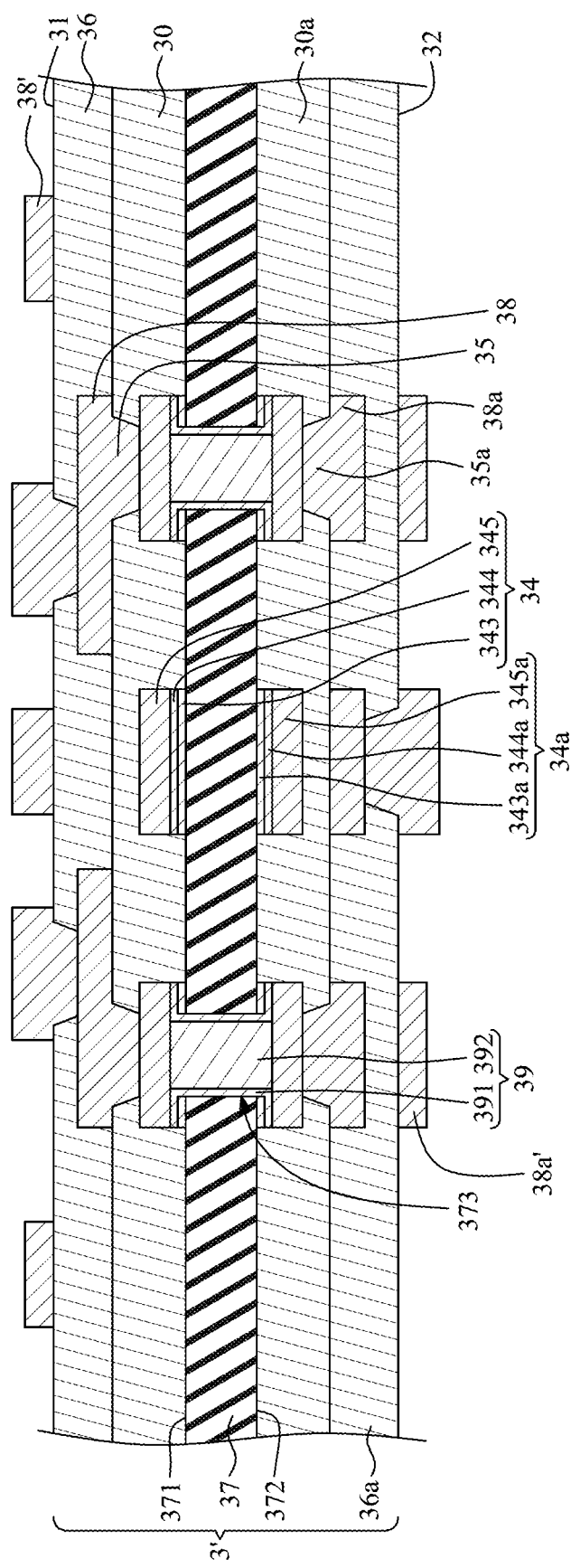
FIG. 13 illustrates one or more stages of an example of a method for manufacturing a wiring structure according to some embodiments of the present disclosure.

Referring to FIG. 13, a lower element 3' is provided. The lower element 3' is similar to the lower element 3 of FIG. 3, and includes the dielectric layers 30, 36, 30*a*, 36*a*, the circuit layers 34, 38, 38', 34*a*, 38*a*, 38*a*', the core portion 37, the upper interconnection vias 35 and the lower interconnection vias 35*a*. An electrical property (such as open circuit/short circuit) of the lower element 3' may be tested.

Figure 14:
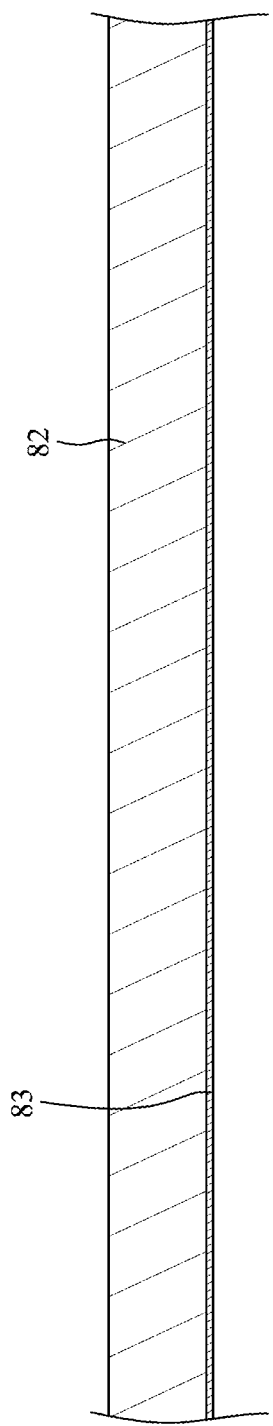
FIG. 14 illustrates one or more stages of an example of a method for manufacturing a wiring structure according to some embodiments of the present disclosure.

Referring to FIG. 14 through FIG. 25, an upper conductive structure 2' is provided. The upper conductive structure 2' is manufactured as follows. Referring to FIG. 14, a carrier 82 with a seed layer 83 is provided. The carrier 82 may be a glass carrier, and may be in a wafer type, a panel type or a strip type. The seed layer 83 may be formed by a physical vapor deposition (PVD) technique or other suitable techniques.

Figure 15:
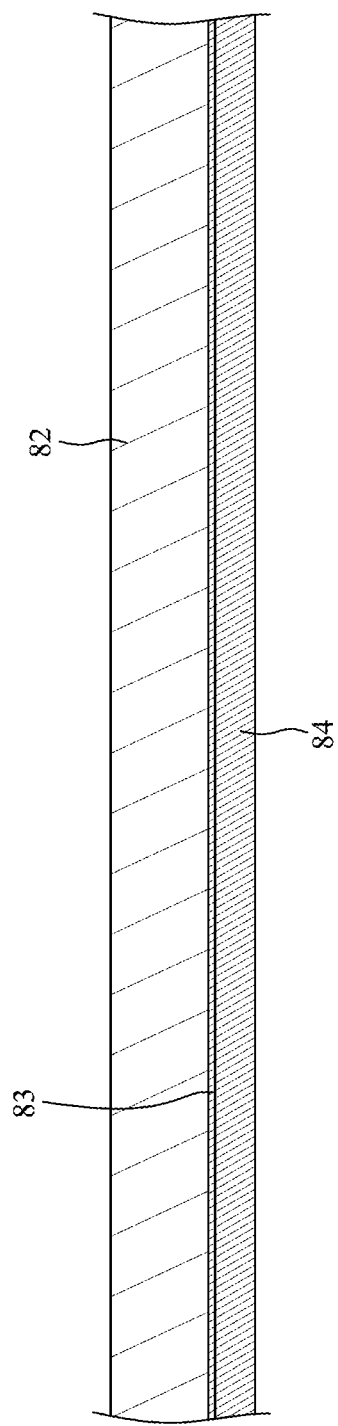
FIG. 15 illustrates one or more stages of an example of a method for manufacturing a wiring structure according to some embodiments of the present disclosure.

Referring to FIG. 15, a photoresist layer 84 is formed on the seed layer 83 by lamination technique or other suitable techniques.

Figure 16:
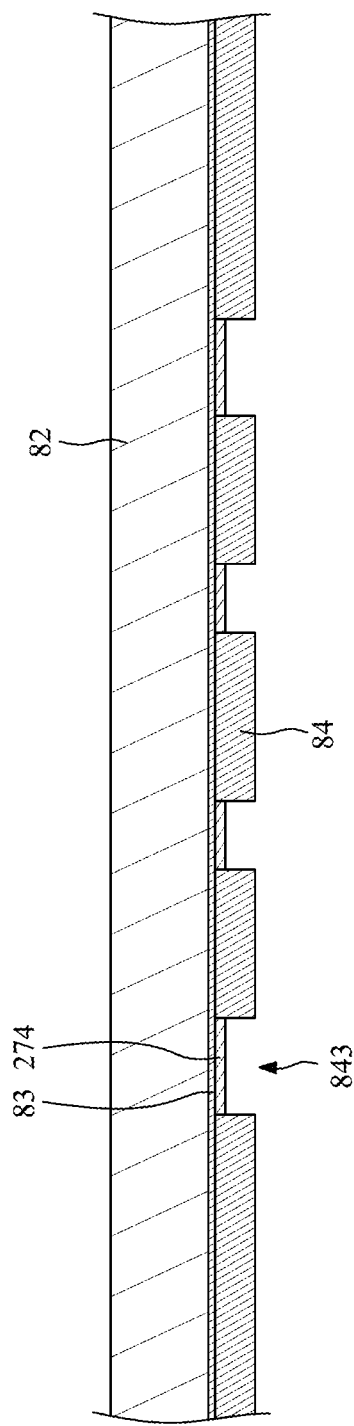
FIG. 16 illustrates one or more stages of an example of a method for manufacturing a wiring structure according to some embodiments of the present disclosure.

Referring to FIG. 16, the photoresist layer 84 is patterned to define a plurality of openings 843 to expose portions of the seed layer 83 by a lithography process or other suitable process. Then, a conductive material 274 may be formed on the seed layer 83 in the openings 843 by a plating technique or other suitable techniques.

Figure 17:
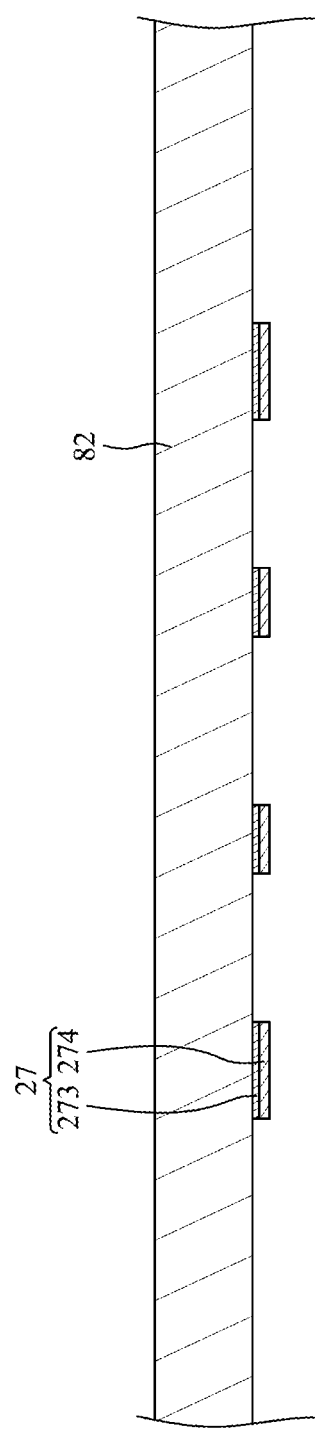
FIG. 17 illustrates one or more stages of an example of a method for manufacturing a wiring structure according to some embodiments of the present disclosure.

Referring to FIG. 17, the photoresist layer 84 is removed by a stripping technique or other suitable techniques. Then, portions of the seed layer 83 that are not covered by the conductive material 274 are removed by an etching technique or other suitable techniques. Meanwhile, an upper circuit layer 27 is formed. The upper circuit layer 27 includes a seed layer 273 formed from the seed layer 83 and the conductive material 274 disposed on the seed layer 273.

Figure 18:
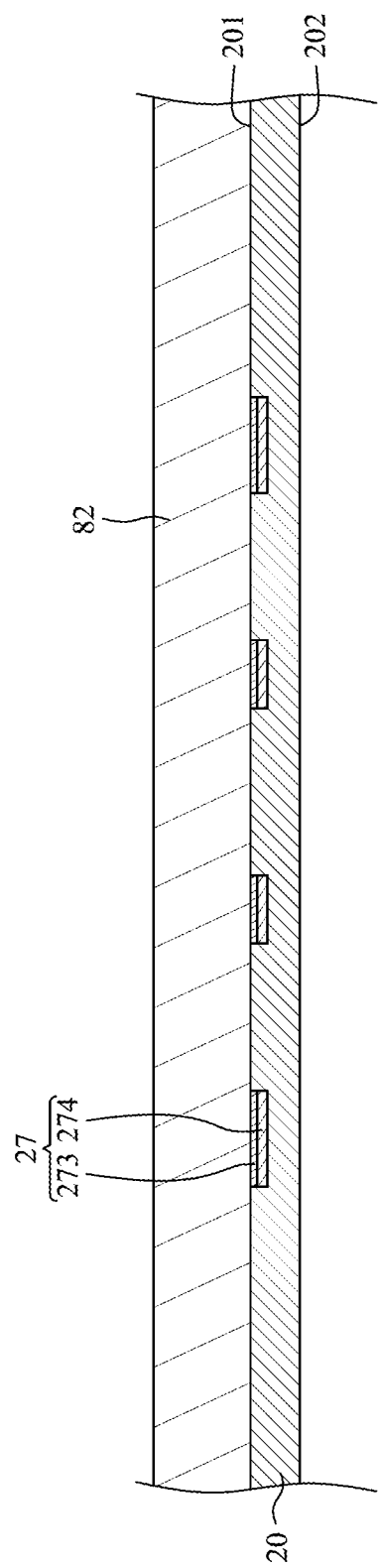
FIG. 18 illustrates one or more stages of an example of a method for manufacturing a wiring structure according to some embodiments of the present disclosure.

Referring to FIG. 18, a dielectric layer 20 is formed or disposed on the carrier 82 to cover the upper circuit layer 27 by lamination technique or other suitable techniques.

Figure 19:
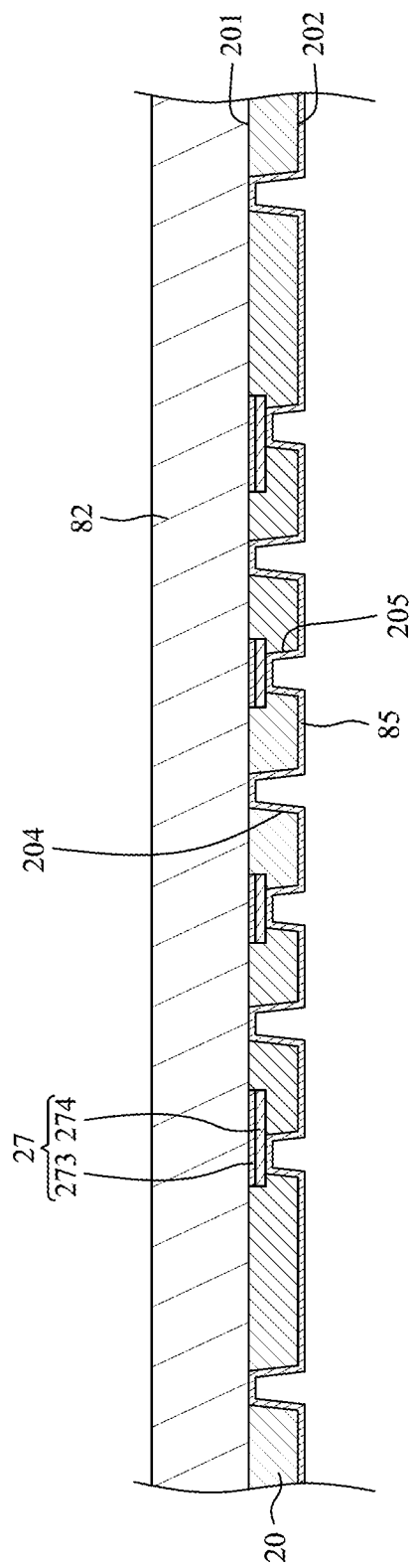
FIG. 19 illustrates one or more stages of an example of a method for manufacturing a wiring structure according to some embodiments of the present disclosure.

Referring to FIG. 19, the dielectric layer 20 is patterned to define a plurality of first through holes 204 to expose portions of the carrier 82 and a plurality of second through holes 205 to expose portions of the upper circuit layer 27 by a lithography process or other suitable process. Then, a seed layer 85 is formed on the dielectric layer 20 and in the first through holes 204 and the second through holes 205 by a physical vapor deposition (PVD) technique or other suitable techniques.

Figure 20:
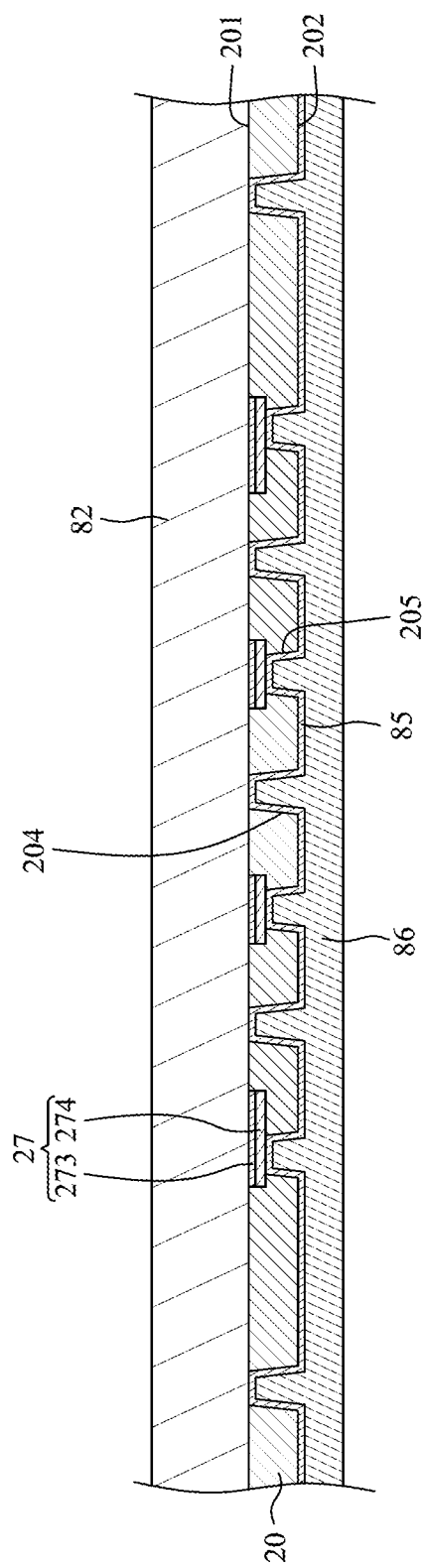
FIG. 20 illustrates one or more stages of an example of a method for manufacturing a wiring structure according to some embodiments of the present disclosure.

Referring to FIG. 20, a photoresist layer 86 is formed on the seed layer 85 by lamination technique or other suitable techniques.

Figure 21:
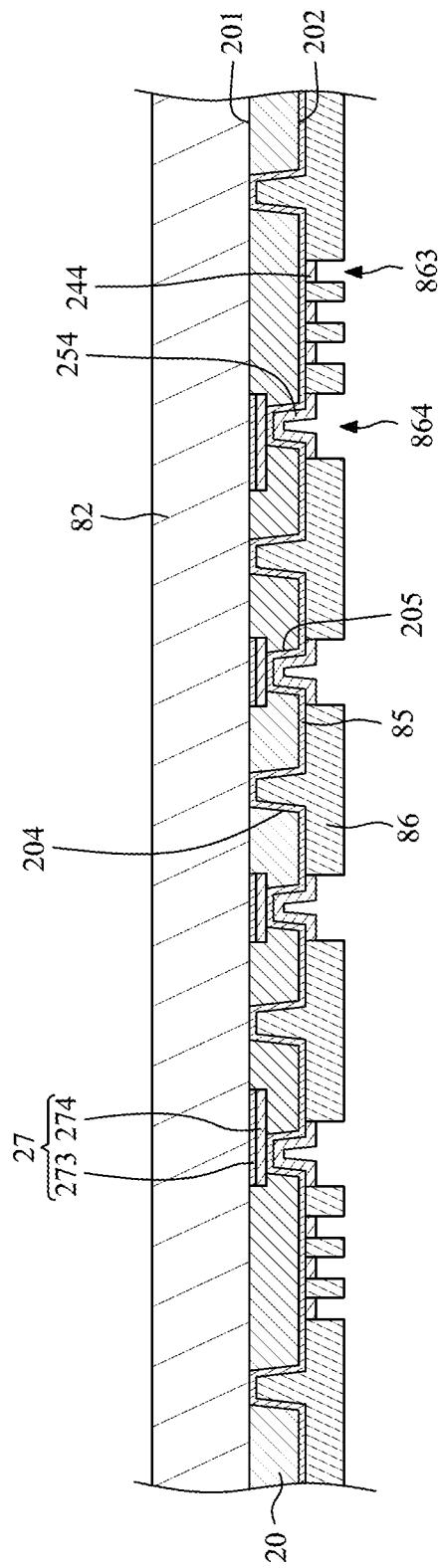
FIG. 21 illustrates a cross-sectional view of a wiring structure according to some embodiments of the present disclosure.

Referring to FIG. 21, the photoresist layer 86 is patterned to define a plurality of first openings 863 and a plurality of second openings 864 to expose portions of the seed layer 85 by a lithography process or other suitable process. The second openings 864 correspond to the second through holes 205. The first openings 863 correspond to the bottom surface 202 of the dielectric layer 20, and do not correspond to the first through holes 204. That is, the portions of the seed layer 85 in the first through holes 204 are still covered by the photoresist layer 86. Then, a conductive material (including a conductive material 244 and a conductive material 254) is formed on the seed layer 85 in the first openings 863 and the second openings 864 by a plating technique or other suitable techniques. In some embodiments, the conductive material 244 is formed on the seed layer 85 in the first openings 863, and the conductive material 254 is formed on the seed layer 85 in the second openings 864.

Figure 22:
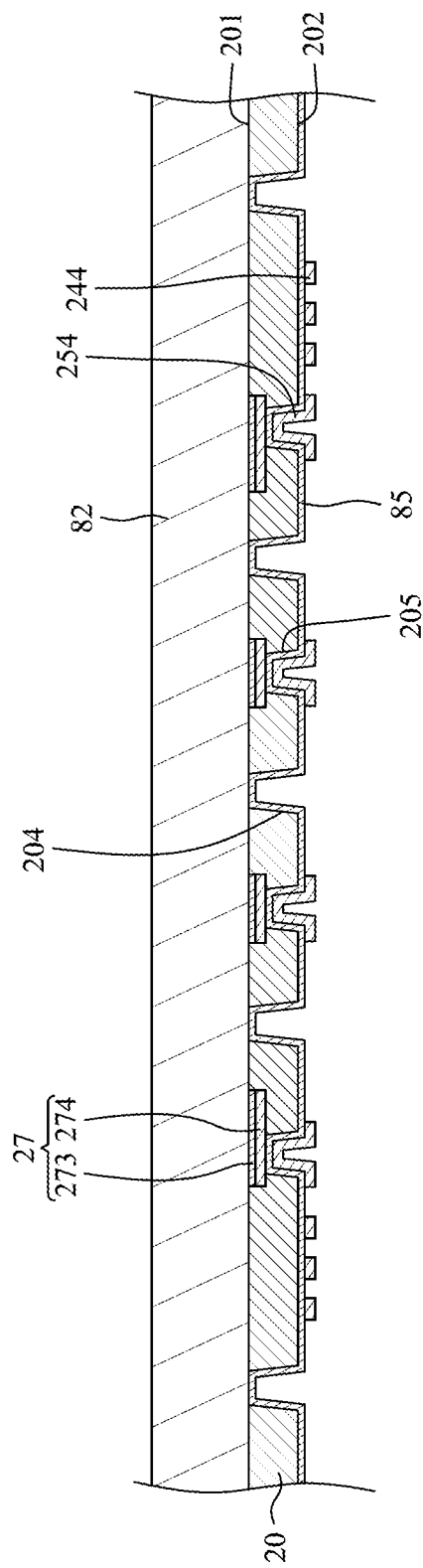
FIG. 22 illustrates a cross-sectional view of a bonding of a package structure and a substrate according to some embodiments of the present disclosure.

Referring to FIG. 22, the photoresist layer 86 is removed by a stripping technique or other suitable techniques.

Figure 23:
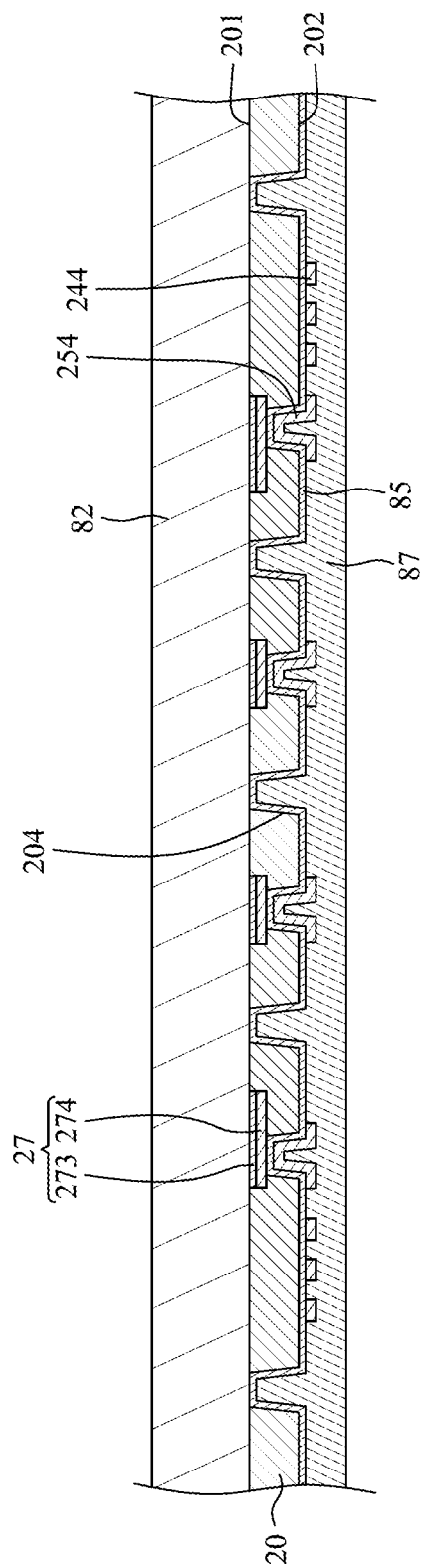
FIG. 23 illustrates one or more stages of an example of a method for manufacturing a wiring structure according to some embodiments of the present disclosure.

Referring to FIG. 23, a photoresist layer 87 is formed on the seed layer 85 by lamination technique or other suitable techniques. As shown in FIG. 23, the photoresist layer 87 covers the conductive material 244 and the conductive material 254.

Figure 24:
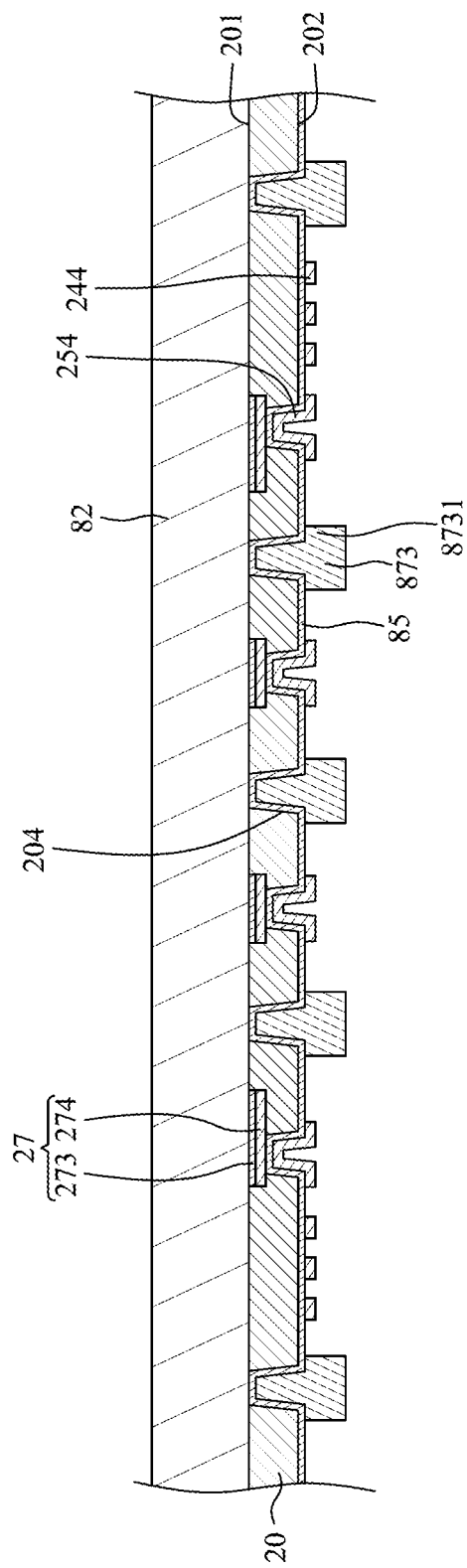
FIG. 24 illustrates one or more stages of an example of a method for manufacturing a wiring structure according to some embodiments of the present disclosure.

Referring to FIG. 24, the photoresist layer 87 is patterned to form a plurality of remaining portions 873 corresponding to the first through holes 204 of the dielectric layer 20 by a lithography process or other suitable process. In some embodiments, the remaining portions 873 are disposed on the seed layer 85 in the first through holes 204 of the dielectric layer 20. In some embodiments, the remaining portion 873 may include an extending portion 8731 to cover the seed layer 85 on the bottom surface 202 of the dielectric layer 20.

Figure 25:
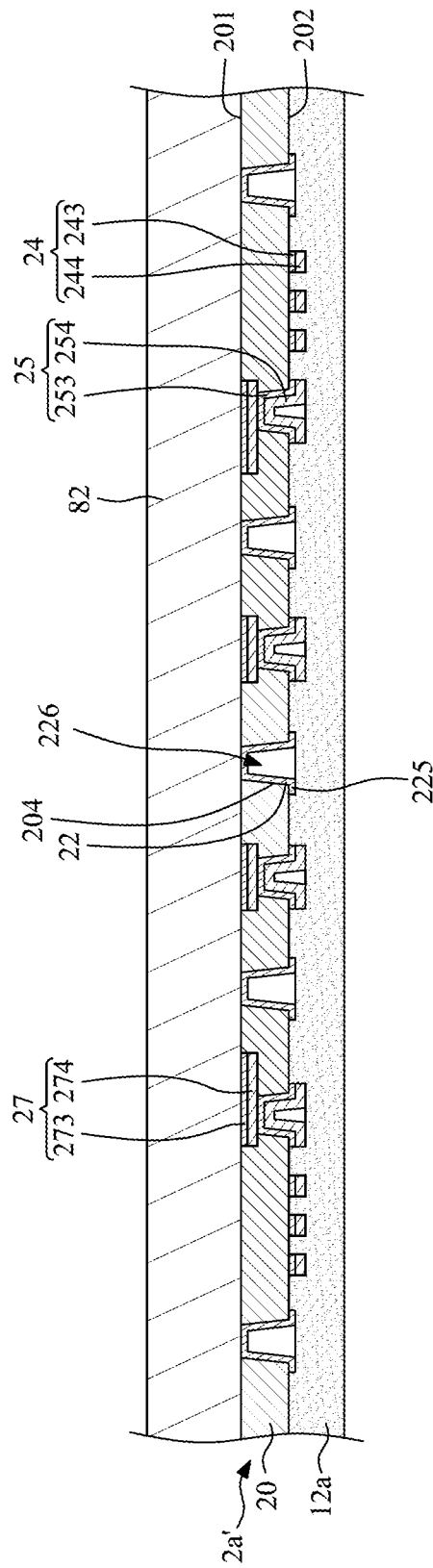
FIG. 25 illustrates one or more stages of an example of a method for manufacturing a wiring structure according to some embodiments of the present disclosure.

Referring to FIG. 25, portions of the seed layer 85 that are not covered by the conductive materials 244, 254 and the remaining portions 873 are removed by an etching technique or other suitable techniques. Meanwhile, a lower circuit layer 24, at least one inner conductive via 25 and at least one dam portion 22 are formed. The lower circuit layer 24 is disposed on the bottom surface 202 of the first dielectric layer 20, and include a seed layer 243 formed from the seed layer 85 and the conductive material 244 disposed on the seed layer 243. The inner conductive via 25 is disposed in the second through hole 205 of the dielectric layer 20, and includes a seed layer 253 formed from the seed layer 85 and a conductive material 254 disposed on the seed layer 253. The dam portion 22 is disposed in the first through hole 204 of the dielectric layer 20, and is formed from the seed layer 85. The dam portion 22 may include at least one extending portion 225 (FIG. 2) disposed on the bottom surface 202 of the dielectric layer 20. It is noted that the extending portion 225 of the dam portion 22 is the portion of the seed layer 85 that is covered by the extending portion 8731 of the remaining portion 873 in FIG. 24. In some embodiments, the inner conductive via 25 and the lower circuit layer 24 may be formed concurrently and integrally. In some embodiments, the dam portion 22, the seed layer 243 of the lower circuit layer 24 and the seed layer 253 of the inner conductive via 25 may be formed from a same seed layer.

Meanwhile, an upper conductive structure 2*a*' is formed. The upper conductive structure 2*a*' includes a dielectric layer 20, a circuit layer (e.g., the lower circuit layer 24) in contact with the dielectric layer 20, and a plurality of dam portions 22. The dam portions 22 extend through the dielectric layer 20, and each of the dam portions 22 defines a central hole 226.

Then, a bonding layer 12*a* is formed or applied on the bottom surface 202 of the dielectric layer 20 to cover the lower circuit layer 24, the inner conductive via 25 and the dam portion 22 by lamination technique or other suitable techniques.

Figure 26:
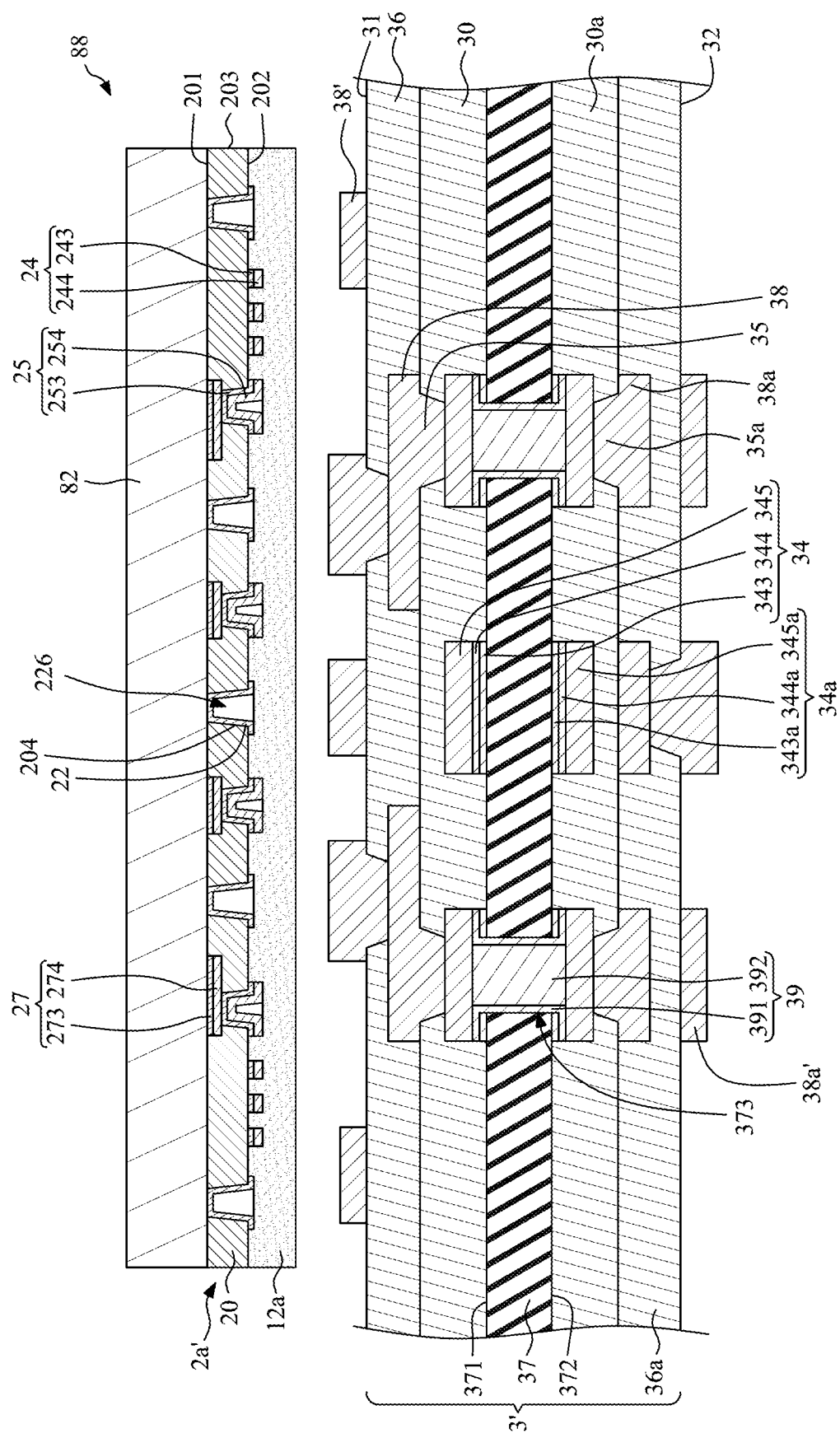
FIG. 26 illustrates one or more stages of an example of a method for manufacturing a wiring structure according to some embodiments of the present disclosure.

Referring to FIG. 26, the upper conductive structure 2*a*', the carrier 82 and the bonding layer 12*a* are cut to form a plurality of unit structures 88. Then, the unit structure 88 is attached to the lower element 3' of FIG. 13. Thus, the upper conductive structure 2*a*' and the carrier 82 are attached to the lower element 3' through the bonding layer 12*a*. The upper conductive structure 2*a*' faces the lower element 3'.

Figure 27:
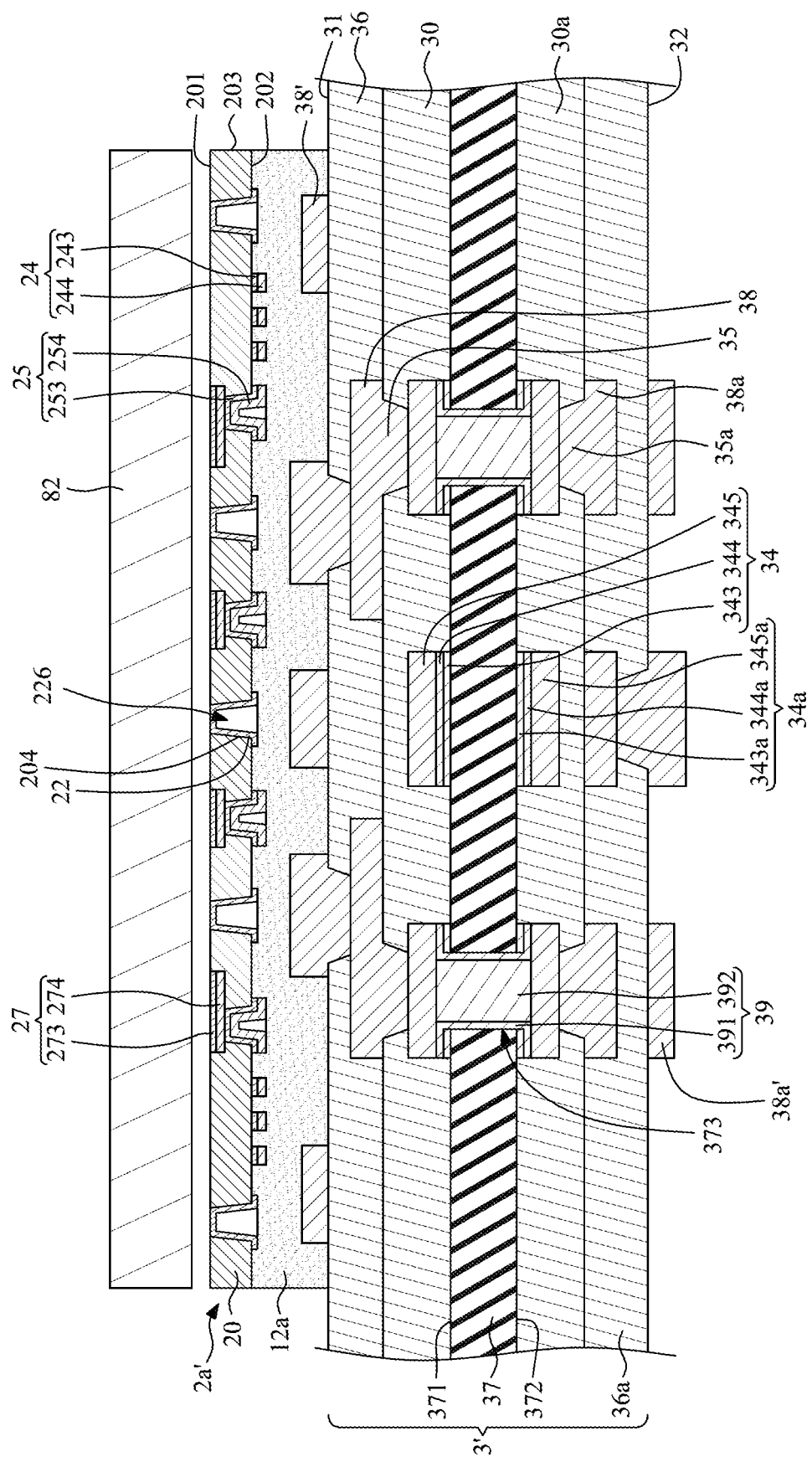
FIG. 27 illustrates one or more stages of an example of a method for manufacturing a wiring structure according to some embodiments of the present disclosure.

Referring to FIG. 27, the bonding layer 12*a* is cured. Then, the carrier 82 is removed.

Figure 28:
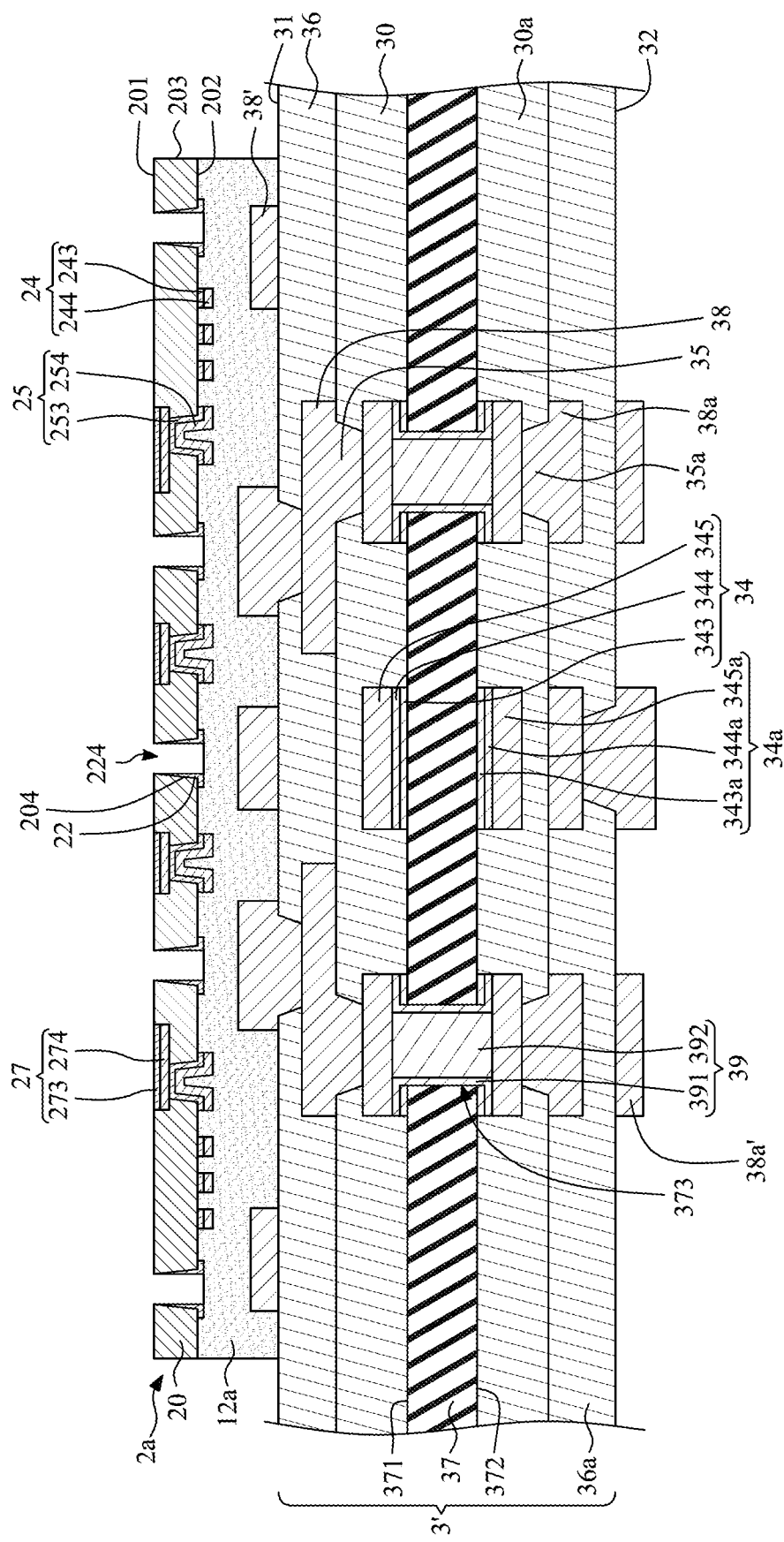
FIG. 28 illustrates one or more stages of an example of a method for manufacturing a wiring structure according to some embodiments of the present disclosure.

Referring to FIG. 28, a portion of the dam portion 22 corresponding to the central hole 226 is removed to form a through hole 224 by, for example, chemical etching. As shown in FIG. 28, the dam portion 22 tapers upwardly along a direction from the bottom surface 202 towards the top surface 201 of the dielectric layer 20. However, the through hole 224 of the dam portion 22 has a substantially consistent width. Meanwhile, the upper conductive structure 2a' becomes the upper conductive structure 2a of FIG. 3.

Figure 29:
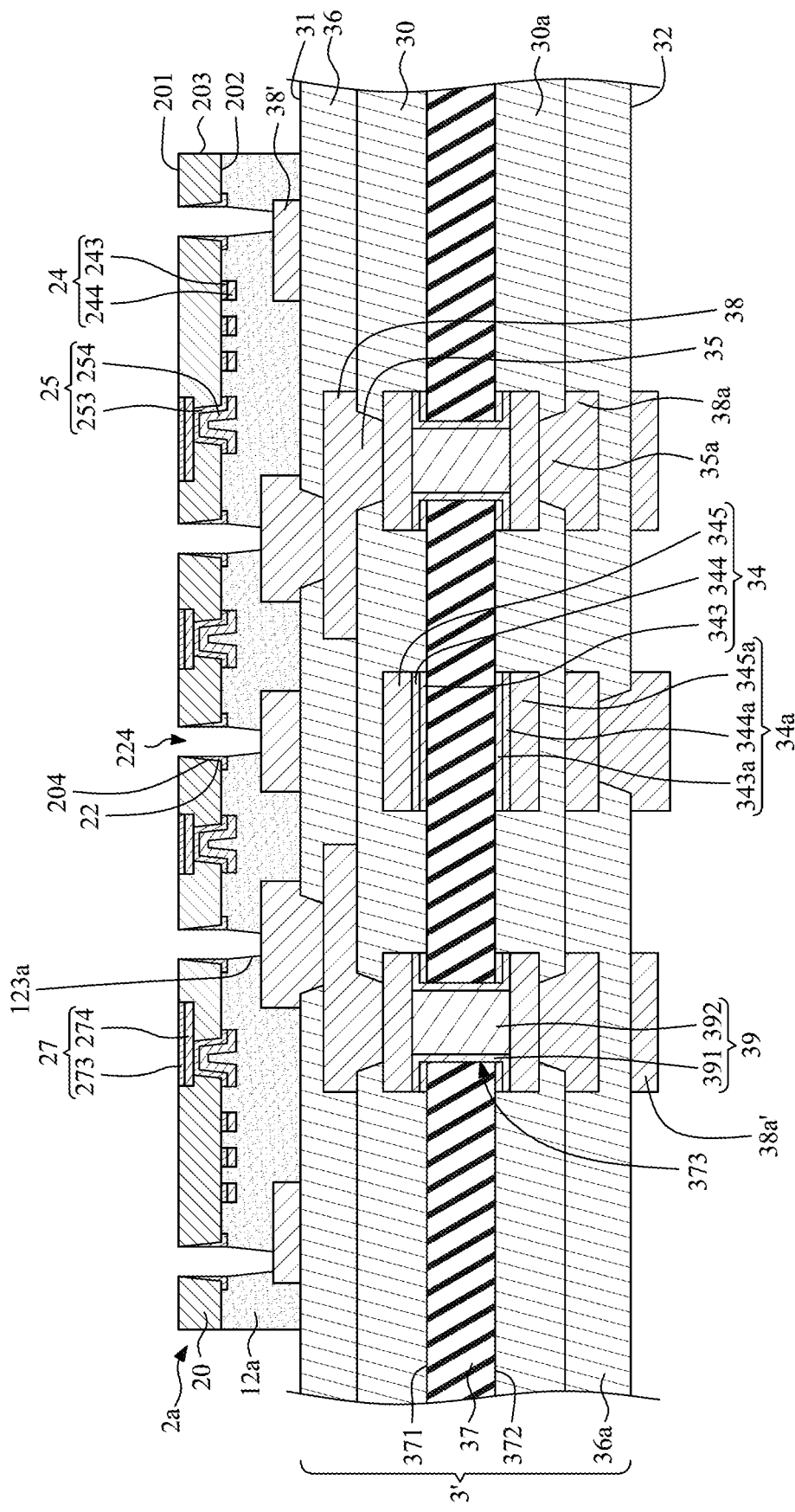
FIG. 29 illustrates one or more stages of an example of a method for manufacturing a wiring structure according to some embodiments of the present disclosure.

Referring to FIG. 29, a portion of the bonding layer 12a under the through hole 224 of the dam portion 22 is removed by, for example, a lithography process or other suitable process, so as to form a through hole 123a.

Figure 30:
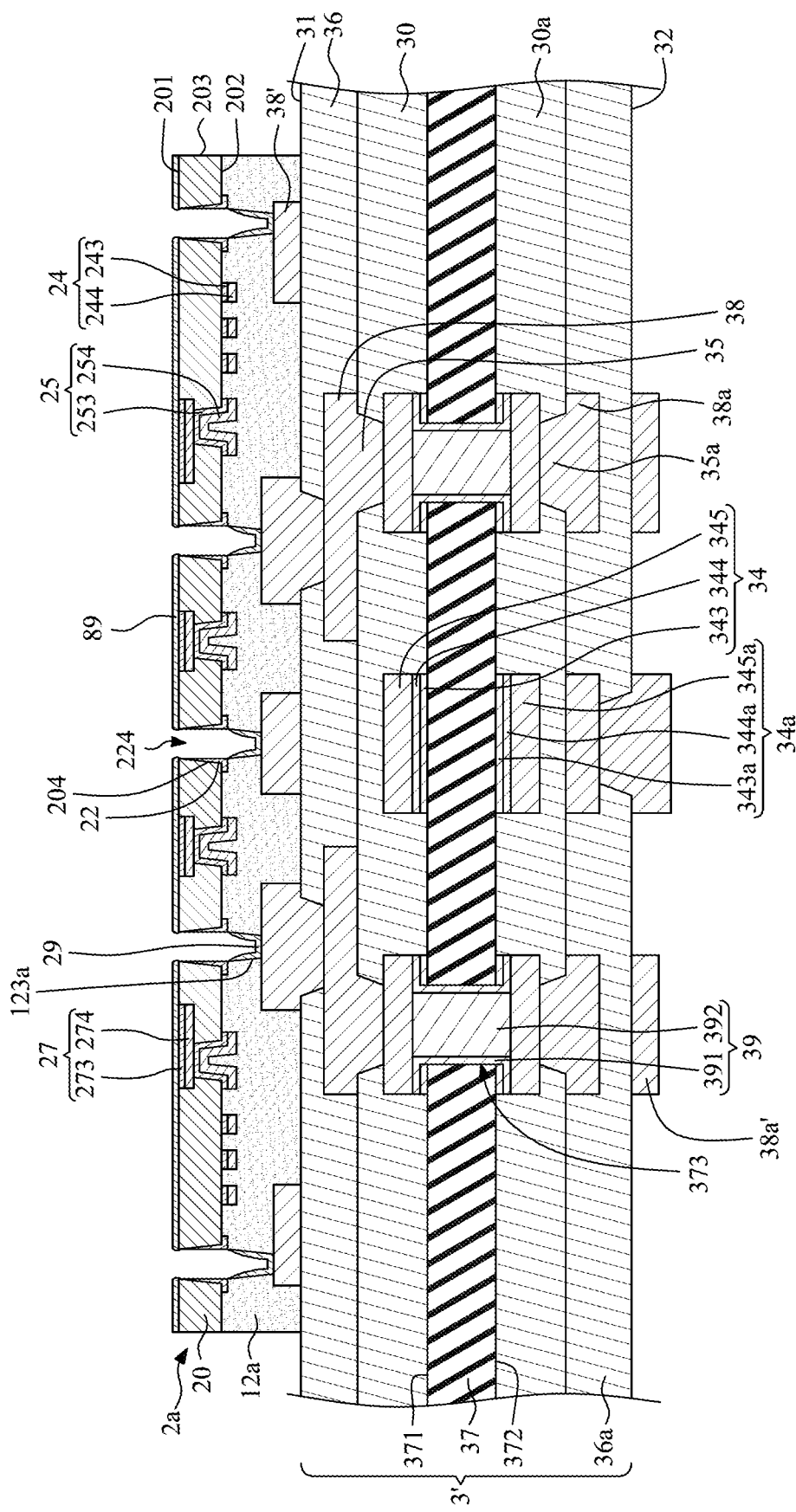
FIG. 30 illustrates one or more stages of an example of a method for manufacturing a wiring structure according to some embodiments of the present disclosure.

Referring to FIG. 30, a metal layer (including, for example, an outer metal layer 89 and a lower metal layer 29) is formed on the top surface 201 of the dielectric layer 20 and in the through hole 123a of the bonding layer 12a by a physical vapor deposition (PVD) technique or other suitable techniques. In some embodiments, the lower metal layer 29 and the outer metal layer 89 may be both seed layers, and their materials may be same as or different from each other. As shown in FIG. 30, the outer metal layer 89 is formed adjacent to or on the top surface 201 of the dielectric layer 20, and a portion of the outer metal layer 89 may extend into the through hole 224 of the dam portion 22 to cover at least a portion of the dam portion 22, as shown in FIG. 2. In addition, the lower metal layer 29 is disposed on an inner surface of the through hole 123a of the bonding layer 12a.

Figure 31:
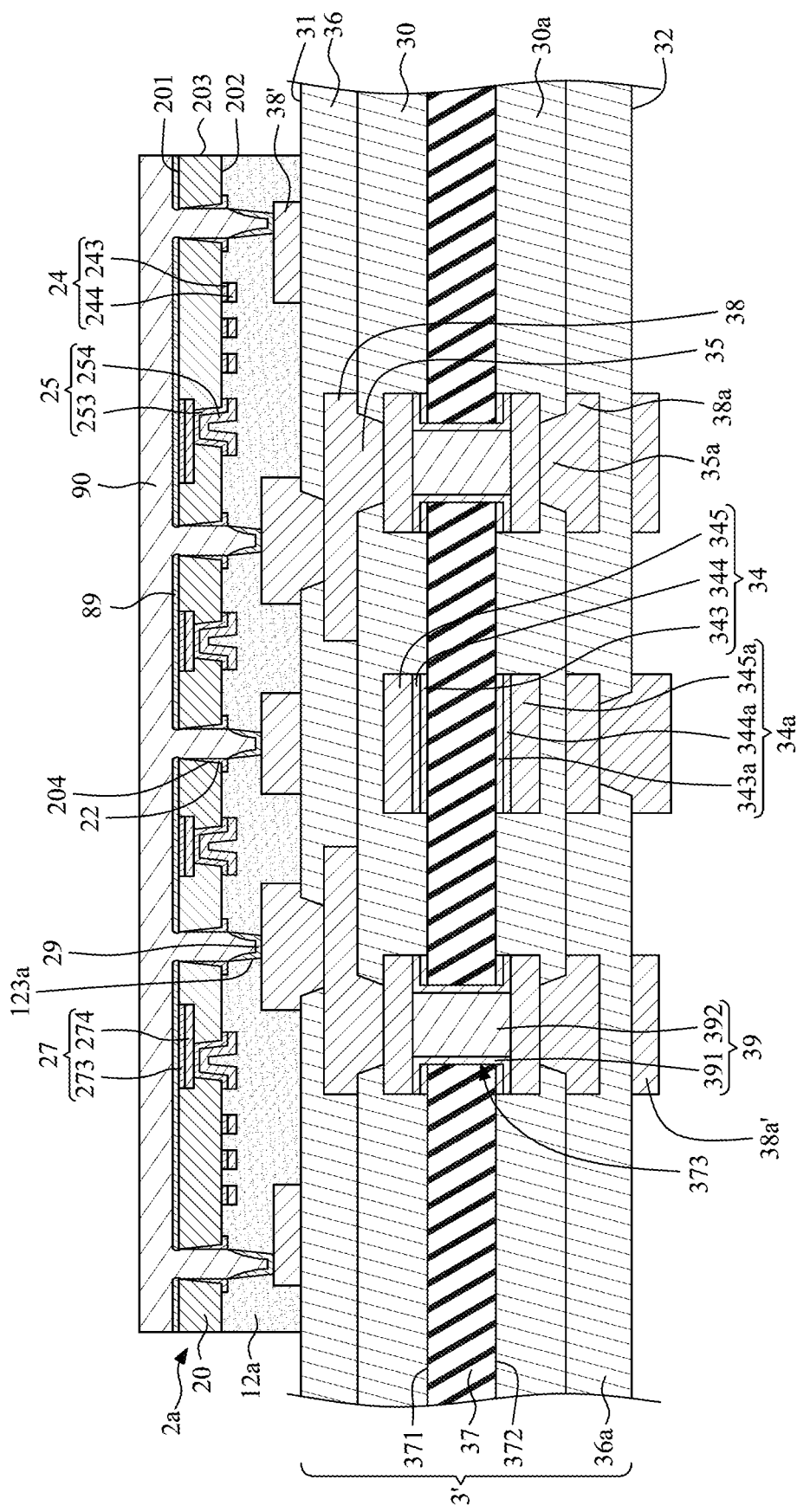
FIG. 31 illustrates a cross-sectional view of a wiring structure according to some embodiments of the present disclosure.

Referring to FIG. 31, a photoresist layer 90 is formed on the metal layer (including, for example, the outer metal layer 89 and the lower metal layer 29) by coating or other suitable techniques. As shown in FIG. 31, the photoresist layer 90 fills the through hole 224 of the dam portion 22.

Figure 32:
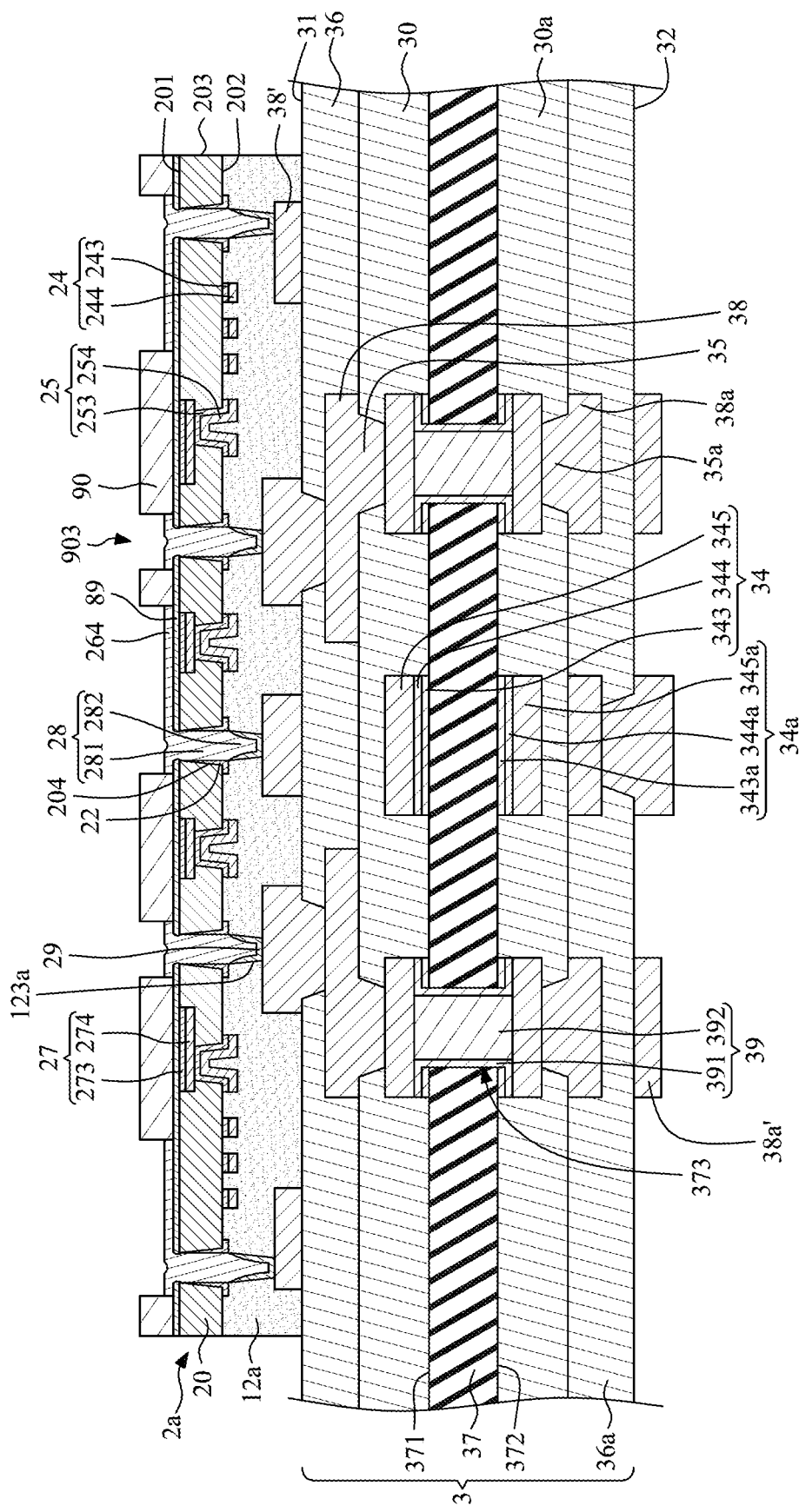
FIG. 32 illustrates a cross-sectional view of a bonding of a package structure and a substrate according to some embodiments of the present disclosure.

Referring to FIG. 32, the photoresist layer 90 is patterned to define a plurality of openings 903 to expose the through hole 224 of the dam portion 22 and portions of the outer metal layer 89 by a lithography process or other suitable process. Then, a conductive material is formed on the outer metal layer 89 in the openings 903 and in the through hole 224 of the dam portion 22 by a plating technique or other suitable techniques. In some embodiments, a portion of the conductive material that is formed on the outer metal layer 89 in the openings 903 is defined as a conductive material 264. A portion of the conductive material that is formed in the through hole 224 of the dam portion 22 is defined as a conductive through via 28. The conductive through via 28 may include a first portion 281 and a second portion 282 under the first portion 281. The first portion 281 may be disposed in the through hole 224 of the dam portion 22. The second portion 282 may be disposed in the through hole 123a of the bonding layer 12a.

Figure 33:
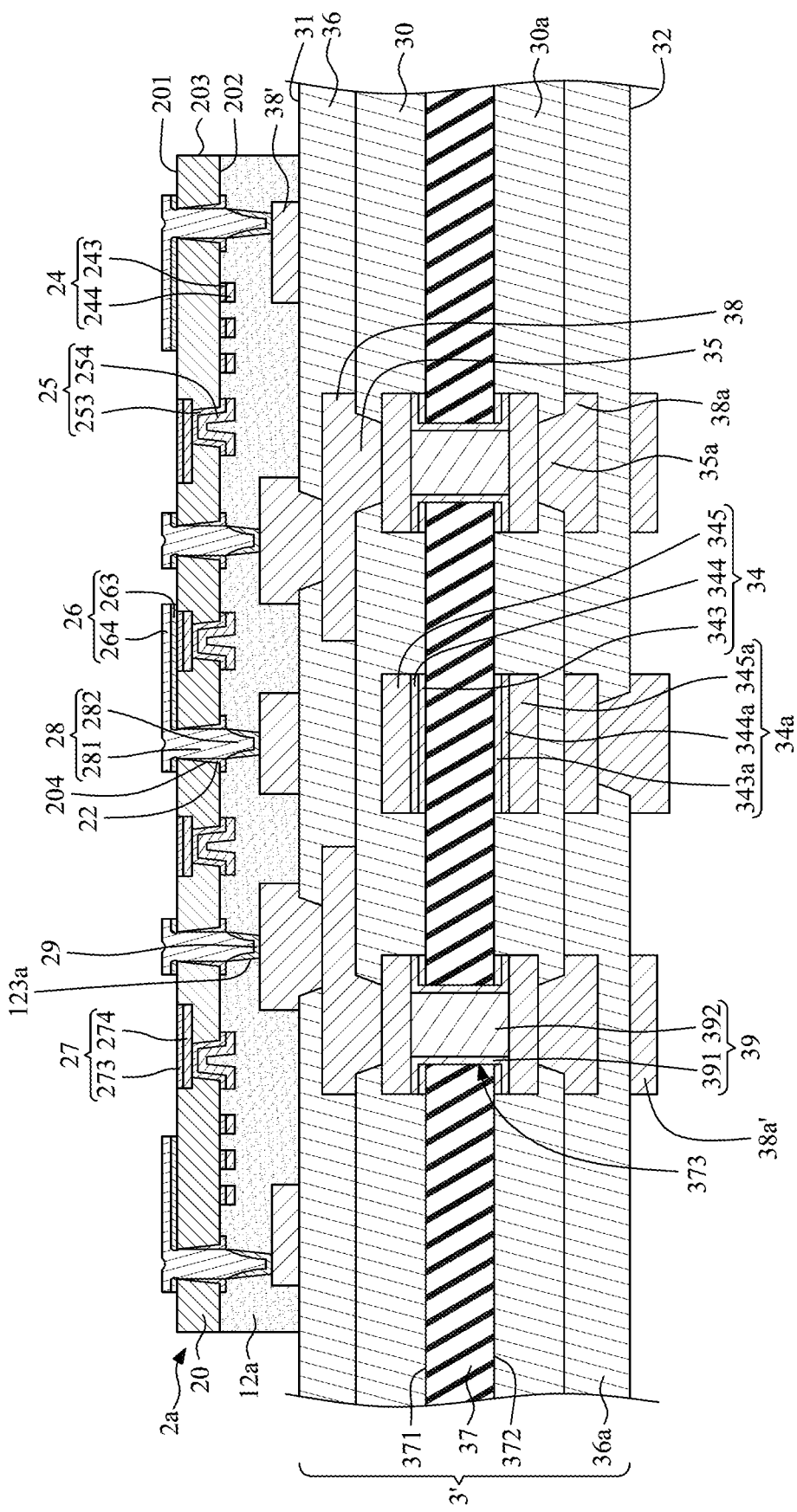
FIG. 33 illustrates one or more stages of an example of a method for manufacturing a wiring structure according to some embodiments of the present disclosure.

Referring to FIG. 33, the photoresist layer 90 is removed by a stripping technique or other suitable techniques. Then, portions of the outer metal layer 89 that are not covered by the conductive materials 264 and the conductive through via 28 are removed by an etching technique or other suitable techniques. Meanwhile, an upper circuit layer 26 is formed. In some embodiments, the outer circuit layer 26 and the conductive through vias 28 may be formed integrally and concurrently. In some embodiments, the outer circuit layer 26 may include an outer metal layer 263 formed from the outer metal layer 89 and an outer conductive material 264 disposed on the outer metal layer 263.

Then, the lower element 3' is singulated so as to obtain the wiring structure 1a of FIG. 3.

Figure 34:
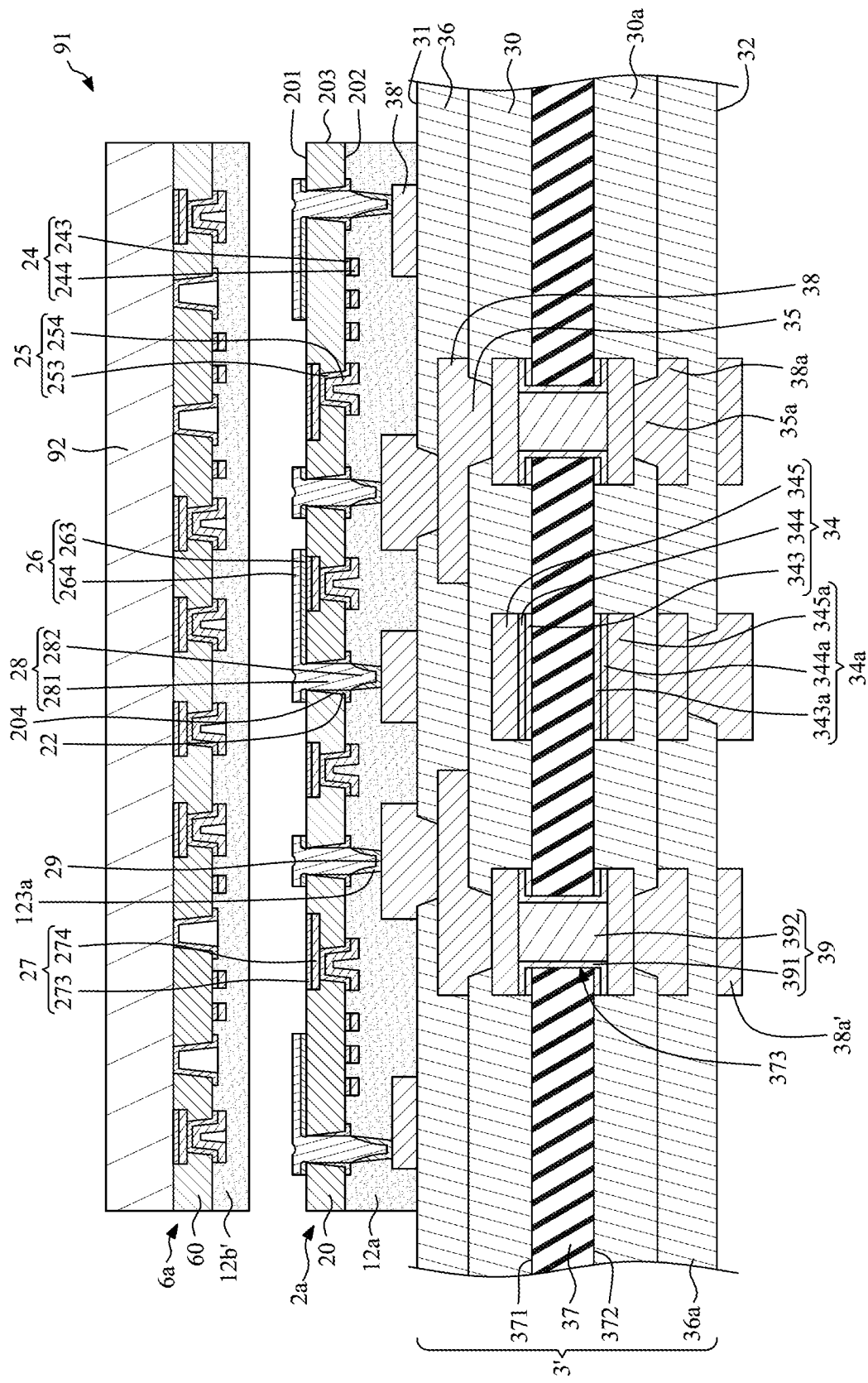
FIG. 34 illustrates one or more stages of an example of a method for manufacturing a wiring structure according to some embodiments of the present disclosure.
Figure 35:
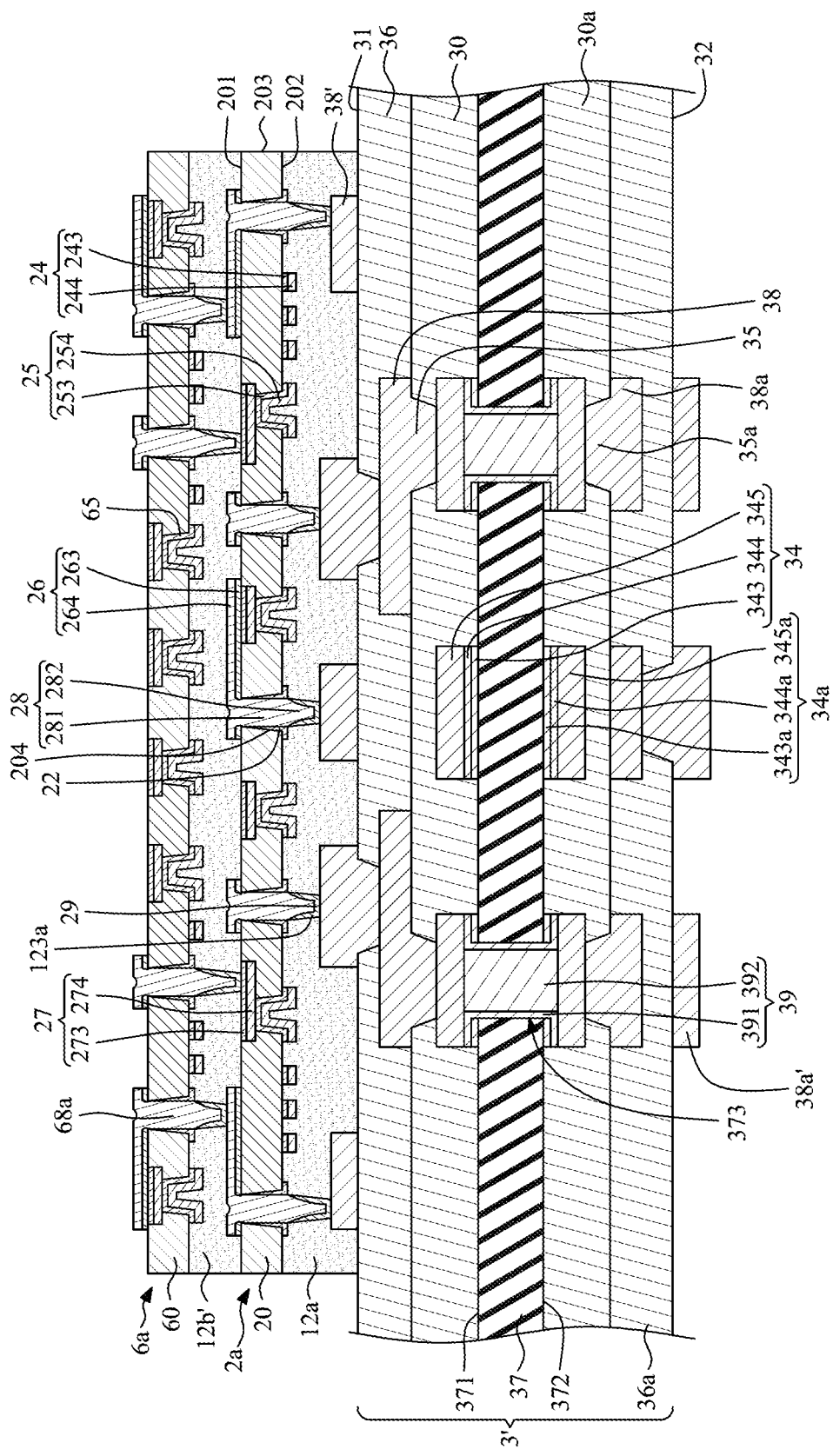
FIG. 35 illustrates one or more stages of an example of a method for manufacturing a wiring structure according to some embodiments of the present disclosure.

FIG. 34 and FIG. 35 illustrate a method for manufacturing a wiring structure according to some embodiments of the present disclosure. In some embodiments, the method is for manufacturing the wiring structure 1b shown in FIG. 4. The initial stages of the illustrated process are the same as, or similar to, the stage illustrated in FIG. 13 to FIG. 33. FIG. 34 depicts a stage subsequent to that depicted in FIG. 33.

Referring to FIG. 34, a unit structure 91 is attached to the upper conductive structure 2a of FIG. 33. The unit structure 91 is similar to the unit structure 88 of FIG. 26, and includes an additional upper conductive structure 6a', a carrier 92 and a bonding layer 12b'.

Referring to FIG. 35, the carrier 92 is removed.

Then, the stages of FIG. 28 to FIG. 33 are repeated so as to form the additional upper conductive structure 6a and the conductive through via 68a.

Then, the stages of FIG. 34 to FIG. 35 and FIG. 28 to FIG. 33 are repeated so as to form the additional upper conductive structure 6b and the conductive through via 68b.

Then, the lower element 3' is singulated so as to obtain the wiring structure 1b of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure comprising:
   a conductive structure including a dielectric layer, a circuit layer in contact with the dielectric layer, at least one dam portion and an outer metal layer, wherein the at least one dam portion extends through the dielectric layer, the at least one dam portion defines a through hole, and the outer metal layer is disposed adjacent to a top surface of the dielectric layer and extends into the through hole of the at least one dam portion; and
   at least one conductive through via disposed in the through hole of the at least one dam portion and electrically connecting the circuit layer.

2. The wiring structure of claim 1, wherein the at least one dam portion and the outer metal layer are both seed layers.

3. The wiring structure of claim 1, wherein the circuit layer includes an upper circuit layer disposed adjacent to the top surface of the dielectric layer.

4. The wiring structure of claim 3, wherein the upper circuit layer is embedded in the dielectric layer and exposed at the top surface of the dielectric layer.

5. The wiring structure of claim 3, further comprising an outer circuit layer disposed on the top surface of the dielectric layer and electrically connecting the at least one conductive through via and the upper circuit layer.

6. The wiring structure of claim 3, wherein the circuit layer further includes a lower circuit layer disposed adjacent to a bottom surface of the dielectric layer, and the lower circuit layer is electrically connected to the upper circuit layer through an inner conductive via.

7. The wiring structure of claim 1, further comprising an outer circuit layer disposed on the top surface of the dielectric layer, wherein the outer circuit layer includes the outer metal layer, and the outer circuit layer and the at least one conductive through via are formed concurrently.

8. The wiring structure of claim 7, wherein the circuit layer includes a lower circuit layer disposed adjacent to a bottom surface of the dielectric layer, and the lower circuit layer is electrically connected to the outer circuit layer through an inner conductive via.

9. The wiring structure of claim 1, wherein the at least one dam portion tapers, and the through hole of the at least one dam portion has a substantially consistent width.

10. The wiring structure of claim 1, wherein a sidewall of the at least one dam portion tapers.

11. The wiring structure of claim 1, wherein the at least one conductive through via contacts the at least one dam portion.

12. The wiring structure of claim 1, wherein the at least one dam portion includes an extending portion disposed on a bottom surface of the dielectric layer.

13. A wiring structure, comprising:
    a lower element;
    an upper conductive structure attached to the lower element through a bonding layer, wherein the upper conductive structure includes a dielectric layer, a circuit layer in contact with the dielectric layer, at least one dam portion and an outer metal layer, wherein the at least one dam portion extends through the dielectric layer, the at least one dam portion defines a through hole, the outer metal layer is disposed adjacent to a top surface of the dielectric layer and extends into the through hole of the at least one dam portion; and
    at least one conductive through via disposed in the through hole of the at least one dam portion, and electrically connecting the lower element and the circuit layer of the upper conductive structure.

14. The wiring structure of claim 13, wherein the lower element includes at least one dielectric layer and at least one circuit layer in contact with the dielectric layer, and the at least one conductive through via terminates on the topmost circuit layer of the lower element, wherein a line spacing of the circuit layer of the lower element is greater than a line spacing of the circuit layer of the upper conductive structure.

15. The wiring structure of claim 13, wherein the lower element is a semiconductor chip and includes at least one pad, and the at least one conductive through via terminates on the at least one pad of the semiconductor chip.

16. The wiring structure of claim 13, wherein a length of the at least one conductive through via is greater than a thickness of the upper conductive structure.

17. The wiring structure of claim 13, wherein the bonding layer defines at least one through hole corresponding to the through hole of the at least one dam portion, and a portion of the at least one conductive through via is disposed in the through hole of the bonding layer.

18. The wiring structure of claim 17, further comprising a lower metal layer disposed on a surface of the through hole of the bonding layer, wherein the outer metal layer and the lower metal layer are formed concurrently, and the at least one conductive through via is disposed on the lower metal layer.

19. A method for manufacturing a wiring structure, comprising:
- (a) providing an upper conductive structure, wherein the upper conductive structure includes a dielectric layer, a circuit layer in contact with the dielectric layer, and at least one dam portion, wherein the at least one dam portion extends through the dielectric layer, the at least one dam portion defines a central hole;
- (b) attaching the upper conductive structure to a lower element through a bonding layer;
- (c) removing a portion of the at least one dam portion corresponding to the central hole to form a through hole;
- (d) forming an outer metal layer adjacent to a top surface of the dielectric layer, wherein the outer metal layer extends into the through hole of the at least one dam portion to cover at least a portion of the at least one dam portion; and
- (e) forming a conductive through via to extend through the upper conductive structure and the bonding layer, and contact the lower element.

20. The method of claim 19, wherein (a) comprises:
- (a1) forming the upper conductive structure on a carrier; and
- (a2) cutting the upper conductive structure and the carrier;

wherein in (b), the upper conductive structure and the carrier are attached to the lower element, wherein the upper conductive structure faces the lower element;

wherein after (b), the method further comprises:
- (b1) removing the carrier.

* * * * *